(12) United States Patent
King et al.

(10) Patent No.: US 8,307,820 B2
(45) Date of Patent: Nov. 13, 2012

(54) SYSTEMS AND METHODS OF GENERATING ENERGY FROM SOLAR RADIATION

(75) Inventors: John D. H. King, La Jolla, CA (US); Thomas E. Oliver, Sacramento, CA (US); Nicholas A. Kramer, Lakeside, CA (US); Keeney D. Willis, Palo Alto, CA (US)

(73) Assignee: Combined Power LLC, Santee, CA (US)

( * ) Notice: Subject to any disclaimer, the term of this patent is extended or adjusted under 35 U.S.C. 154(b) by 34 days.

(21) Appl. No.: 12/849,761

(22) Filed: Aug. 3, 2010

(65) Prior Publication Data
US 2011/0030675 A1    Feb. 10, 2011
US 2011/0126825 A2    Jun. 2, 2011

Related U.S. Application Data

(60) Provisional application No. 61/231,081, filed on Aug. 4, 2009, provisional application No. 61/233,667, filed on Aug. 13, 2009, provisional application No. 61/244,349, filed on Sep. 21, 2009.

(51) Int. Cl.
*F24J 2/14* (2006.01)

(52) U.S. Cl. ........ 126/634; 126/685; 126/692; 126/625; 126/600; 126/697; 126/571; 126/652; 126/624; 126/676; 126/672; 359/847

(58) Field of Classification Search ............ 126/634, 126/685, 692, 625, 600, 697, 571, 652, 624, 126/676, 672; 359/847
See application file for complete search history.

(56) References Cited

U.S. PATENT DOCUMENTS

| | | | | |
|---|---|---|---|---|
| 3,125,091 | A | * | 3/1964 | Sleeper .................. 126/624 |
| 4,051,834 | A | * | 10/1977 | Fletcher et al. .......... 126/625 |
| 4,156,420 | A | * | 5/1979 | Gunderson .............. 126/655 |
| 4,182,307 | A | | 1/1980 | Brindle et al. |
| 4,233,958 | A | | 11/1980 | Heden |
| 4,874,225 | A | * | 10/1989 | Pruszenski, Jr. .......... 359/592 |
| 5,445,177 | A | * | 8/1995 | Laing et al. ............ 136/246 |
| 5,465,708 | A | | 11/1995 | Goebel et al. |
| 5,650,050 | A | | 7/1997 | Kaufmann |
| 6,223,743 | B1 | | 5/2001 | Prueitt |
| 6,877,507 | B2 | | 4/2005 | Braun |
| 7,980,024 | B2 | | 7/2011 | Berzin et al. |
| 2004/0055594 | A1 | | 3/2004 | Hochberg et al. |
| 2007/0199560 | A1 | | 8/2007 | Hobbs et al. |
| 2009/0260620 | A1 | * | 10/2009 | Winger et al. ............ 126/600 |
| 2010/0186733 | A1 | | 7/2010 | Hoefler |

FOREIGN PATENT DOCUMENTS

| WO | WO 2008/119094 A2 | 10/2008 |
|---|---|---|
| WO | WO 2008-120943 | 10/2008 |
| WO | WO 2010/132917 A1 | 11/2010 |

* cited by examiner

*Primary Examiner* — Steven B McAllister
*Assistant Examiner* — Avinash Savani
(74) *Attorney, Agent, or Firm* — Eric L. Lane; McKenna Long & Aldridge LLP

(57) ABSTRACT

A solar reflector assembly is provided for generating energy from solar radiation. The solar reflector assembly is configured to be deployed on a supporting body of liquid and to reflect solar radiation to a solar collector. A solar reflector assembly comprises an inflatable elongated tube having an upper portion formed at least partially of flexible material and a lower ballast portion formed at least partially of flexible material. A reflective sheet is coupled to a wall of the tube to reflect solar radiation. The elongated tube has an axis of rotation oriented generally parallel to a surface of a supporting body of liquid.

20 Claims, 29 Drawing Sheets

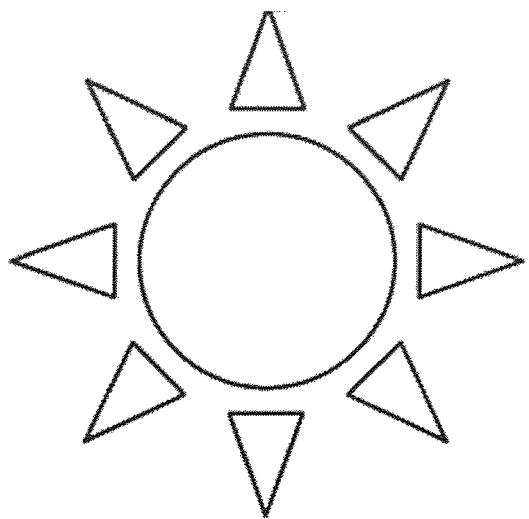
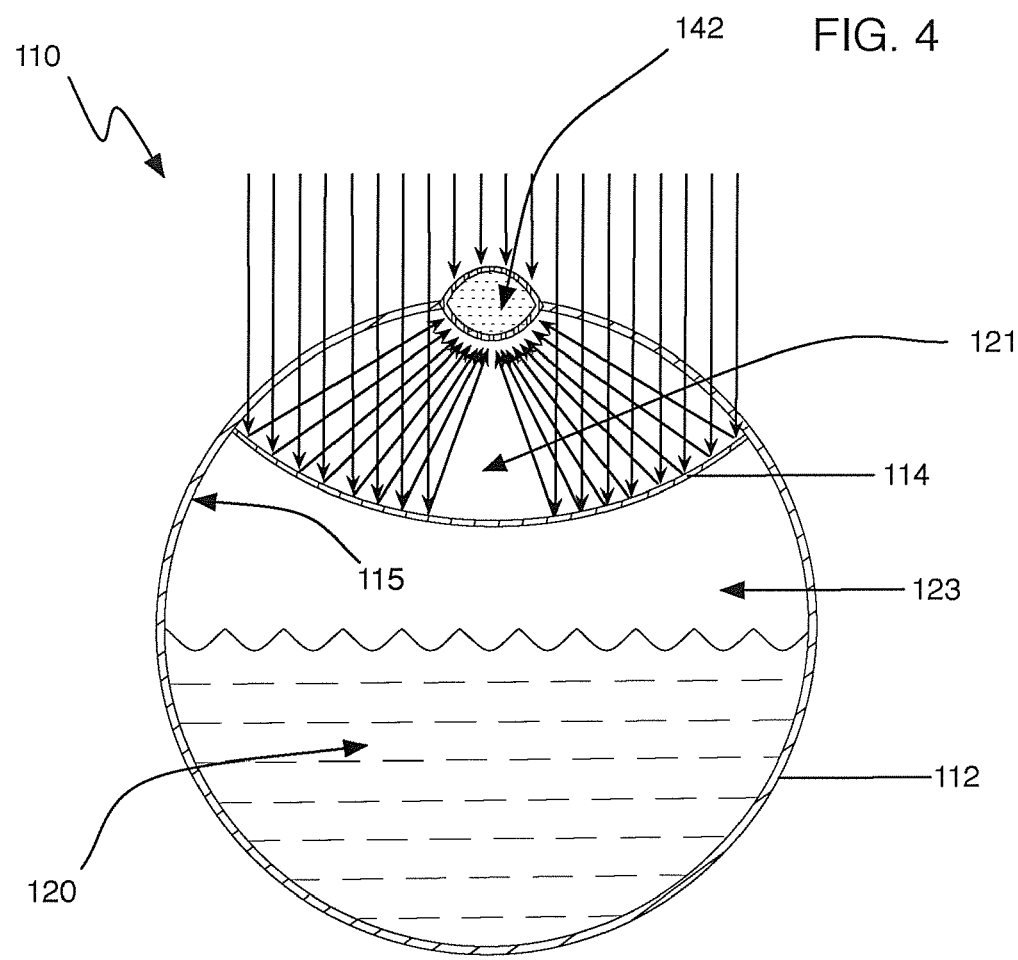
FIG. 4

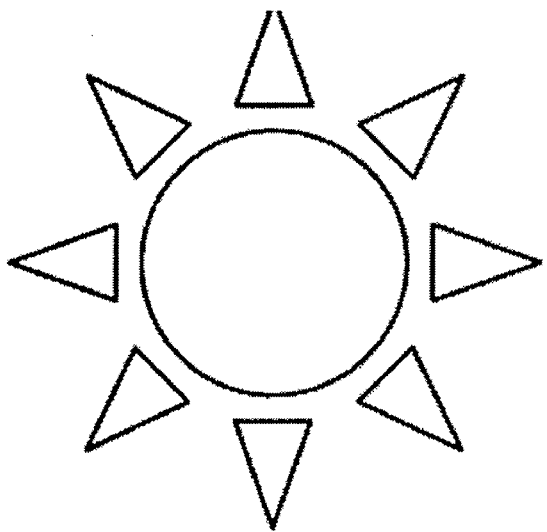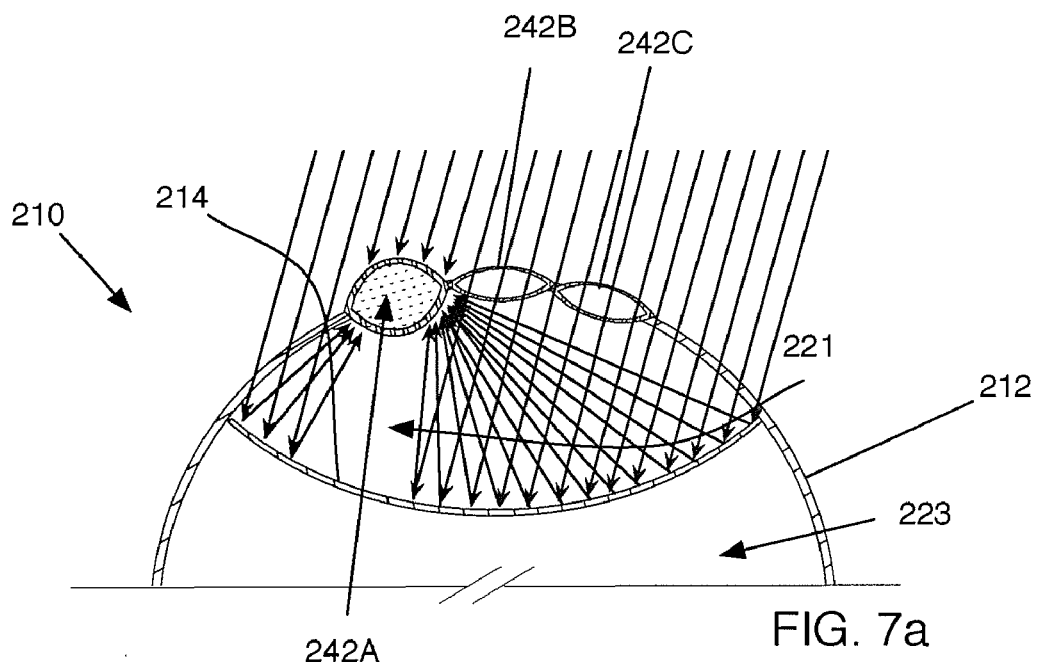
FIG. 7a

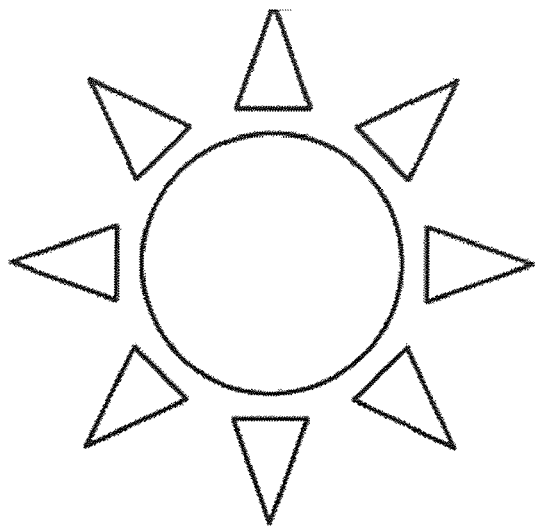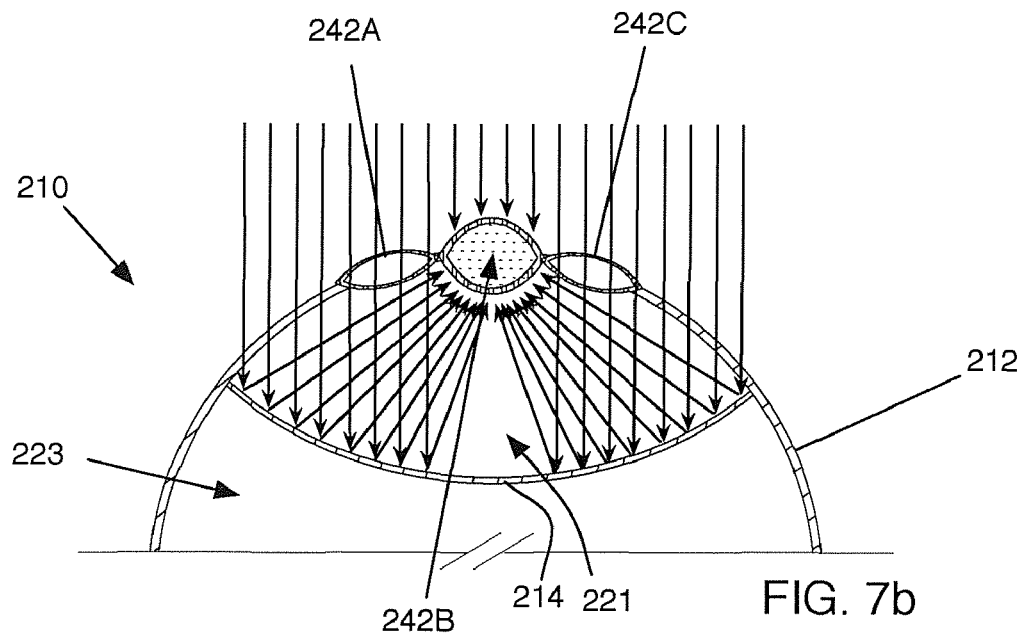
FIG. 7b

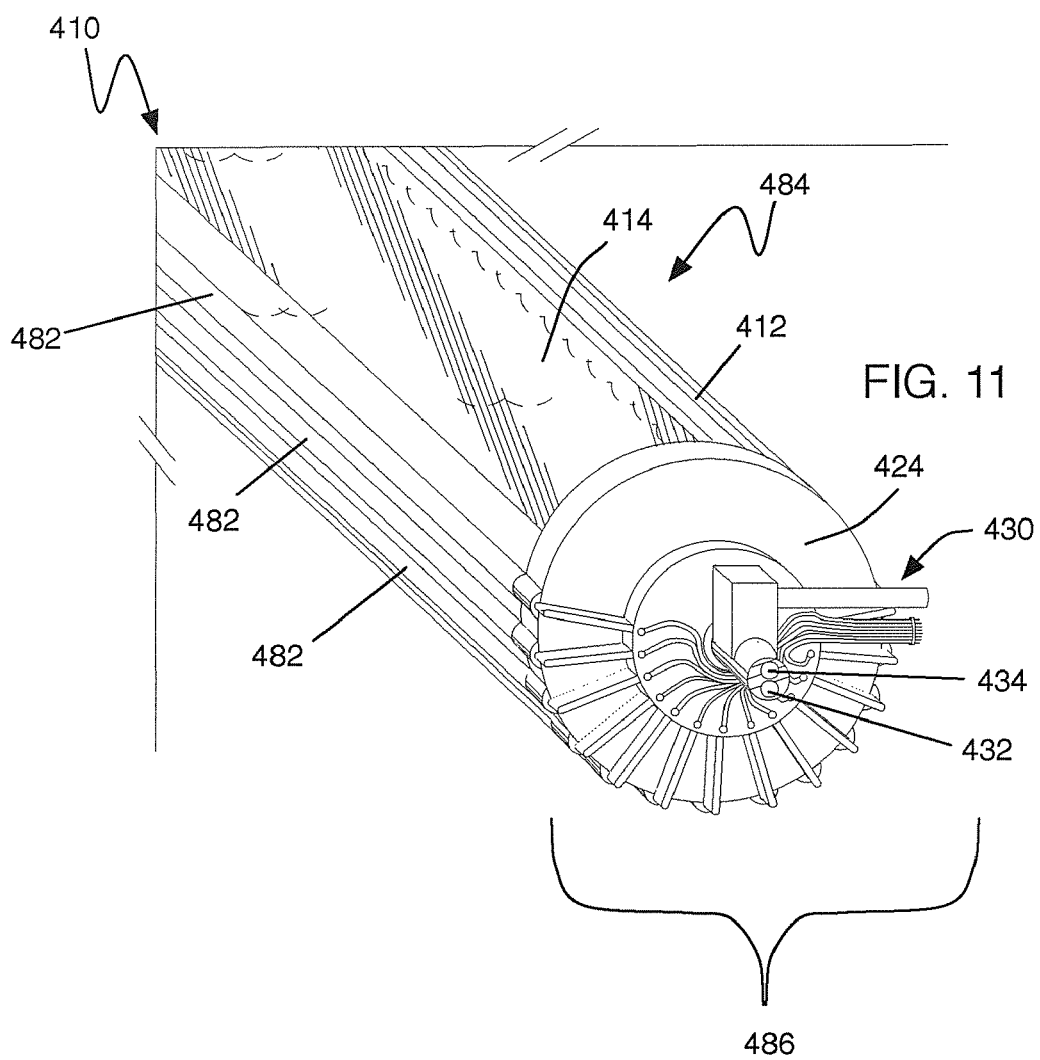

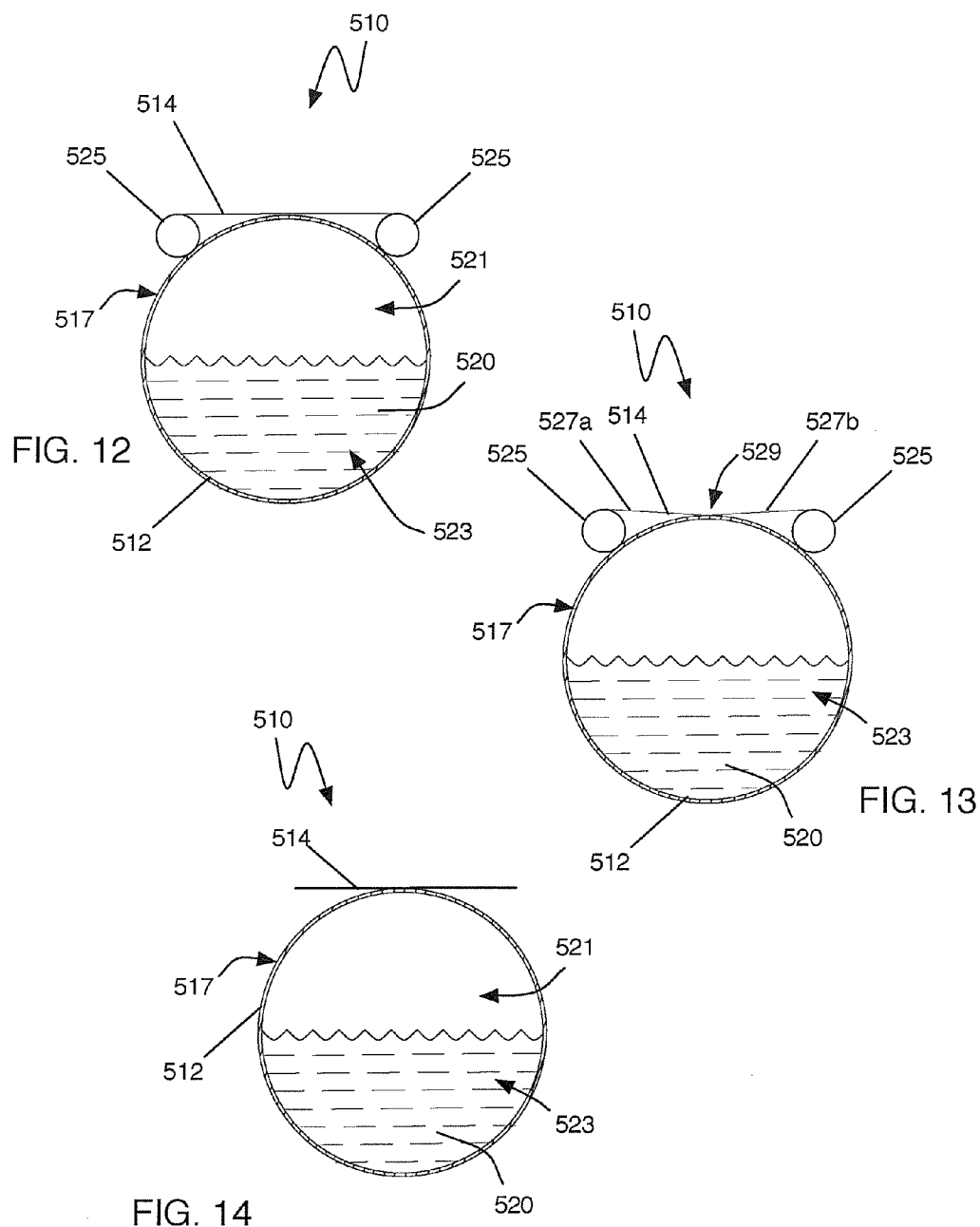

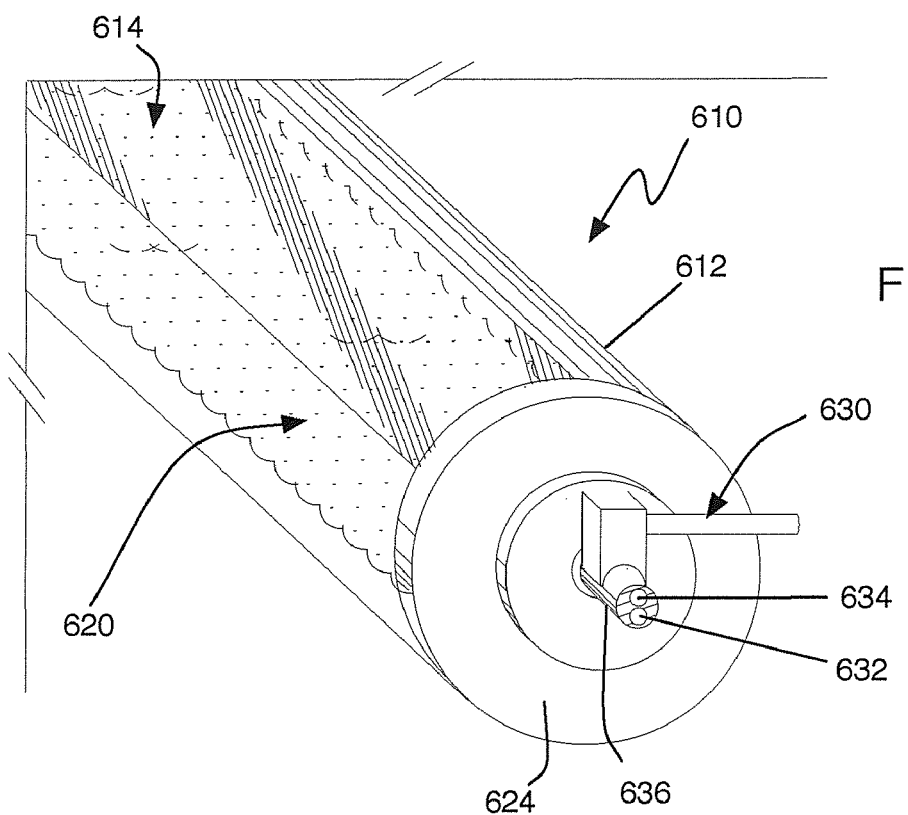

SYSTEMS AND METHODS OF GENERATING ENERGY FROM SOLAR RADIATION

CROSS-REFERENCE TO RELATED APPLICATIONS

This application claims priority to U.S. Patent Application Ser. Nos. 61/231,081, filed Aug. 4, 2009, 61/233,667, filed Aug. 13, 2009, and 61/244,349, filed Sep. 21, 2009, each of which is incorporated by reference herein in its entirety.

FIELD OF THE DISCLOSURE

The present disclosure relates to solar energy systems.

BACKGROUND OF THE DISCLOSURE

There has been a long-standing need to provide energy generation from renewable sources. Various renewable energy sources have been pursued, such as solar energy; wind, geothermal, and biomass for biofuels as well as others.

Solar radiation has long been a prime candidate for fulfilling this need. Various approaches have been taken to achieve energy generation from solar radiation. To that end, much focus has been directed to creating a low cost solar energy conversion system that functions with high efficiency and requires little maintenance.

For example, solar panels formed of photovoltaic cells (solar cells) are used to transform light to electricity. Such systems have been implemented in various applications. Solar panels have been generally effective for small-scale electrical generation, such as powering small electronics, electrical generation for residential applications, and electrical generation for space-based systems. However, current solar panel technology has been ineffective for large-scale uses, such as electrical generation sufficient for municipal applications. The costs associated with such large-scale usages have been prohibitive. Current solar panels are relatively expensive and do not allow cost-effective energy storage.

Other approaches include concentrating solar radiation on solar collectors for energy generation, commonly referred to as concentrated solar power (CSP). CSP systems typically use reflective surfaces to concentrate the sun's energy from a large surface area on to a solar collector. For example, the concentrated solar energy can be used to heat a working fluid. The heated fluid is then used to power a turbine to generate electricity. Alternatively, photovoltaic cells can be used at the solar collector, eliminating the need for numerous, expensive cells. In an effort to maximize efficiency, the reflective surfaces of CSP systems can be coupled to a device that tracks the sun's movement, maintaining a focus on a receiver target throughout the day. Using this approach, the CSP system can optimize the level of solar radiation directed towards the solar collector.

Although such CSP systems are better than traditional flat-panel photovoltaic cells for large-scale applications, shortfalls exist. For example, glass and metal reflector assemblies are expensive to manufacture, ship and install. Further, current tracking devices used with CSP can be relatively expensive and complicated. As a result, current approaches have yet to achieve significant market penetration because of cost issues.

Biomass production, such as algae and other microorganisms, has increasingly been of interest. The potential usage of such material is found across a wide range of applications, including biofuel feedstock production, fertilizer, nutritional supplements, pollution control, and other uses.

Current approaches for biomass production include "closed-air" systems that contain biomass production within a controlled environment, limiting exposure to outside air. Examples of such systems include closed photo-bioreactor structures forming a closed container for housing a culture medium for generating biomass. Having a controlled environment helps maximize the generation of algal material by limiting exposure to invasive species as well as controlling other environmental factors that promote algal growth. Closed-air systems significantly reduce evaporation and therefore significantly reduce demands on water resources. In addition, closed-air systems facilitate the sequestration of carbon dioxide gas, which promotes algal growth, facilities compliance with environmental regulations, and, according to a large number of scientists, benefits the environment generally. However, such systems can be expensive and, in many instances, cost prohibitive.

It should be appreciated that there remains a need for a system and method of generating energy from solar radiation in a low-cost, large-scale manner. There also exists a need for a closed-air photo-bioreactor to promote algal growth in a low-cost, large-scale manner. The present disclosure fulfills these needs and others.

SUMMARY OF THE DISCLOSURE

In general terms, the present disclosure provides a solar reflector assembly useable for generating energy from solar radiation. Embodiments of the solar reflector assemblies are inflatable elongated tubes of flexible material with each tube including a reflective sheet to reflect solar radiation to a solar collector. This structure and the materials employed provide significant cost savings for manufacture, shipping and deployment of the solar reflector assemblies. The solar reflector assembly is configured to be deployed on a supporting body of liquid. This provides both liquid ballasting capability and structural support. Beneficially, the solar reflector assemblies are inexpensive to manufacture, deploy and operate, providing a cost effective solution for energy generation.

Exemplary embodiments of a solar reflector assembly includes an inflatable elongated tube having an upper portion formed at least partially of a flexible material and a lower ballast portion formed at least partially of a flexible material. The lower ballast portion may define a reservoir containing fluid facilitating ballast. The elongated tube has an axis of rotation oriented generally parallel to a surface of a supporting body of liquid and a reflective sheet coupled to a wall of the tube to reflect solar radiation towards the solar collector. The reflective sheet may be coupled to either an interior wall or an exterior wall of the elongated tube. The fluid facilitating ballast has a top surface that is generally parallel to a surface of a supporting body of liquid.

In exemplary embodiments, the reflective sheet can be configured to reflect substantially all solar radiation towards the solar collector. In another exemplary embodiment, the reflective sheet can be configured to substantially reflect a first prescribed wavelength range towards a solar collector and to substantially transmit a second prescribed wavelength range therethrough. In the case of an interior reflective sheet, the reflective sheet may also facilitate equilibrium of pressure on its opposing sides. One end cap assembly may be coupled to the elongated tube, or a pair of end cap assemblies can be coupled to the elongated tube, in which at least one of the end cap assemblies is configured to facilitate the flow of gas and/or liquid into and out of the elongated tube to maintain pressure within the tube. The upper portion formed of thin-gauge, flexible material allows solar radiation to pass through for reflection by the reflective sheet.

Inflatable supports can be disposed on the exterior wall of the tube to maintain the reflective sheet in a prescribed orientation. For example, the reflective sheet can be disposed to have various cross sectional shapes, including flat, v-shaped, u-shaped, or parabolic, among others, as desired. A pair of supports can be used, coupled to longitudinal sides of the reflective sheet.

In a detailed aspect of an exemplary embodiment, the reflective sheet is formed as a hot mirror, configured to reflect infrared (IR) radiation (e.g., heat reflective) while allowing visible light to pass through (e.g., visibly transparent), across wide angles of incidence. For example, the reflective sheet allows transmittance of at least 50 percent of incident energy in the wavelength band between about 400 nm and 700 nm at normal incidence. In a detailed aspect of an exemplary embodiment, the reflective sheet allows transmittance of at least 90 percent of incident energy in the wavelength band between about 400 nm and 700 nm at normal incidence.

In another detailed aspect of selected exemplary embodiments, the reflective sheet can have a high percentage of reflection for substantially all incident solar IR radiation above about 700 nm or, in other embodiments, above about 750 nm. In yet other embodiments, the reflective sheet can be configured to have a high percentage of reflection within a bounded range of IR wavelengths. Exemplary ranges include 700-1200 nm, 700-2000 nm, 750-1200 nm, and 750-2000 nm, among others. It should be appreciated that other ranges can be used.

More particularly, by example and not limitation, a system for generating energy from solar radiation is provided, comprising a pool housing a supporting body of liquid and one or more solar reflector assemblies disposed on the supporting body of liquid. Each solar reflector assembly includes an inflatable elongated tube having an upper portion formed at least partially of flexible material, a lower ballast portion formed at least partially of flexible material and an axis of rotation oriented generally parallel to a surface of the supporting body of liquid, and a reflective sheet coupled to a wall of the tube to reflect solar radiation towards a solar collector. The reflective sheet may be coupled to an interior wall of the elongated tube such that the upper portion and the lower ballast portion are separated by the reflective sheet. Alternatively, the reflective sheet may be coupled to an exterior wall of the elongated tube.

The reflective sheet may be coupled to the elongated tube in a manner to provide a pressure differential between opposing sides of the reflective sheet such that the reflective sheet can be given a prescribed shape to facilitate reflection of solar radiation towards the solar collector. The solar reflector assembly may facilitate equilibrium of pressure on opposing sides of the reflective sheet. The lower ballast portion of the elongated tube contains liquid facilitating ballast. The liquid facilitating ballast has a top surface that is generally parallel to the surface of the supporting body of liquid. The system further includes a solar collector positioned to receive reflected solar radiation from the reflective sheet.

Embodiments of the system for generating energy from solar radiation may further comprise an electrical generator assembly operatively coupled to the solar collector to convert the reflected solar radiation to electricity. At least one end cap assembly can be coupled to an elongated tube, and a pair of end cap assemblies can be coupled to opposing ends of the one or more elongated tubes, in which at least one of the end cap assemblies is configured to facilitate the flow of gas and/or liquid into and out of the elongated tube to maintain pressure within the tube. A rotation assembly may be coupled to an elongated tube at any location on the tube. In exemplary embodiments, a rotation assembly is coupled to at least one of the end cap assemblies to induce controlled rotation of the elongated tubes to direct the reflected solar radiation to the solar collector.

In an exemplary embodiment, the reflective sheet is coupled to the elongated tube in a manner to provide a pressure differential between opposing sides of the reflective sheet such that the reflective sheet can be given a prescribed shape to facilitate reflection of solar radiation towards the solar collector. Alternatively, the reflective sheet can be configured to be taut when the elongated tube is inflated to form a generally planar shape. In yet another embodiment, the reflective sheet can be configured to hang between spaced-apart portions of the internal wall of the tube to form a generally catenary shape.

In an exemplary embodiment, the elongated tube defines an elongated reservoir extending the length of the tube for passing a heat-transfer fluid therethrough, the elongated reservoir positioned above the reflective sheet such that solar radiation reflected by the reflective sheet is directed towards the elongated reservoir. The elongated tube can further define a plurality of elongated reservoirs positioned above the reflective sheet, defining multiple focal areas of reflected radiation present at different angles of incident solar radiation. In this manner, the solar collector can be coupled to the tube, through which a heat-transfer fluid can pass to absorb the reflected radiation, and then be used to power electricity generation.

In exemplary embodiments, the solar reflector assembly may comprise one or more pass-through fittings coupled to the elongated tube to facilitate the flow of gas and liquid into and out of the elongated tube.

In a detailed example of an exemplary embodiment, the solar reflector assembly or system can include a rotation assembly coupled to at least one end of the elongate tube and configured to rotate the elongated tube such that the reflective sheet directs solar radiation towards the solar collector throughout the day. In one approach, the rotation assembly can include a plurality of gas bladders coupled to the elongated tube, in which the rotation assembly is configured to adjust the content of gas bladders to rotate the elongated tube. In another approach, the rotation assembly is coupled to at least one end of the elongated tube to induce controlled rotation of the elongated tube to direct the reflected solar radiation towards the solar collector.

In another exemplary embodiment, a plurality of elongated tubes are coupled together along longitudinal sides, forming a raft, in which a reflective sheet is disposed either within or atop each tube. The tubes can further include one or more reservoirs for passing heat-transfer fluid through. Alternatively, an external solar collector can be disposed in a prescribed location, spaced apart from an elongated tube or from the raft of elongated tubes to receive reflected solar radiation from the reflective sheets.

The elongated tube may further comprise a culture medium for photosynthetic biomass, thus forming a combined solar reflector and photobioreactor assembly ("CSP/PBR"). The culture medium housed in the tube can be used, e.g., to facilitate photosynthetic biomass growth, such as algal biomass. The reflective sheet may be configured to substantially reflect a first prescribed wavelength range towards a solar collector and to substantially transmit a second prescribed wavelength range therethrough to the culture medium within the elongated tube. In this manner, a portion of solar energy is directed towards the solar collector, while another portion is utilized by the culture medium, e.g., to facilitate photosynthetic biomass growth, such as algal biomass. The CSP/PBR assemblies may be disposed on a supporting body of liquid and include a solar collector positioned to receive reflected solar radiation from the reflective sheet. Beneficially, this embodiment serves to reduce the heat input, and therefore the cooling load for the biomass production component of such an embodiment.

For purposes of summarizing the disclosure and the advantages achieved over the prior art, certain advantages of the disclosure have been described herein. Of course, it is to be understood that not necessarily all such advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other advantages as may be taught or suggested herein.

All of these embodiments are intended to be within the scope of the disclosure herein disclosed. These and other embodiments of the present disclosure will become readily apparent to those skilled in the art from the following detailed description of the preferred embodiments having reference to the attached figures, the disclosure not being limited to any particular preferred embodiment disclosed.

BRIEF DESCRIPTION OF THE DRAWINGS

Embodiments of the present disclosure will now be described, by way of example only, with reference to the following drawings in which:

FIG. 4 is a cross-sectional view of an embodiment of a solar energy collection system in accordance with the present disclosure;

FIGS. 7a-c are cross-sectional views of an embodiment of a solar reflector assembly in accordance the present disclosure;

FIG. 11 is a perspective view of an embodiment of a solar reflector assembly in accordance with the present disclosure;

FIG. 12 is a cross-sectional view of an embodiment of a solar reflector assembly having an external reflector in accordance with the present disclosure;

FIG. 13 is a cross-sectional view of an embodiment of a solar reflector assembly having an external reflector in accordance with the present disclosure;

FIG. 14 is a cross-sectional view of an embodiment of a solar reflector assembly having an external reflector in accordance with the present disclosure;

FIG. 19a is a perspective view of an embodiment of an end cap assembly coupled to a concentrated solar power/photobioreactor assembly in accordance with the present disclosure;

DETAILED DESCRIPTION

Figure 1:
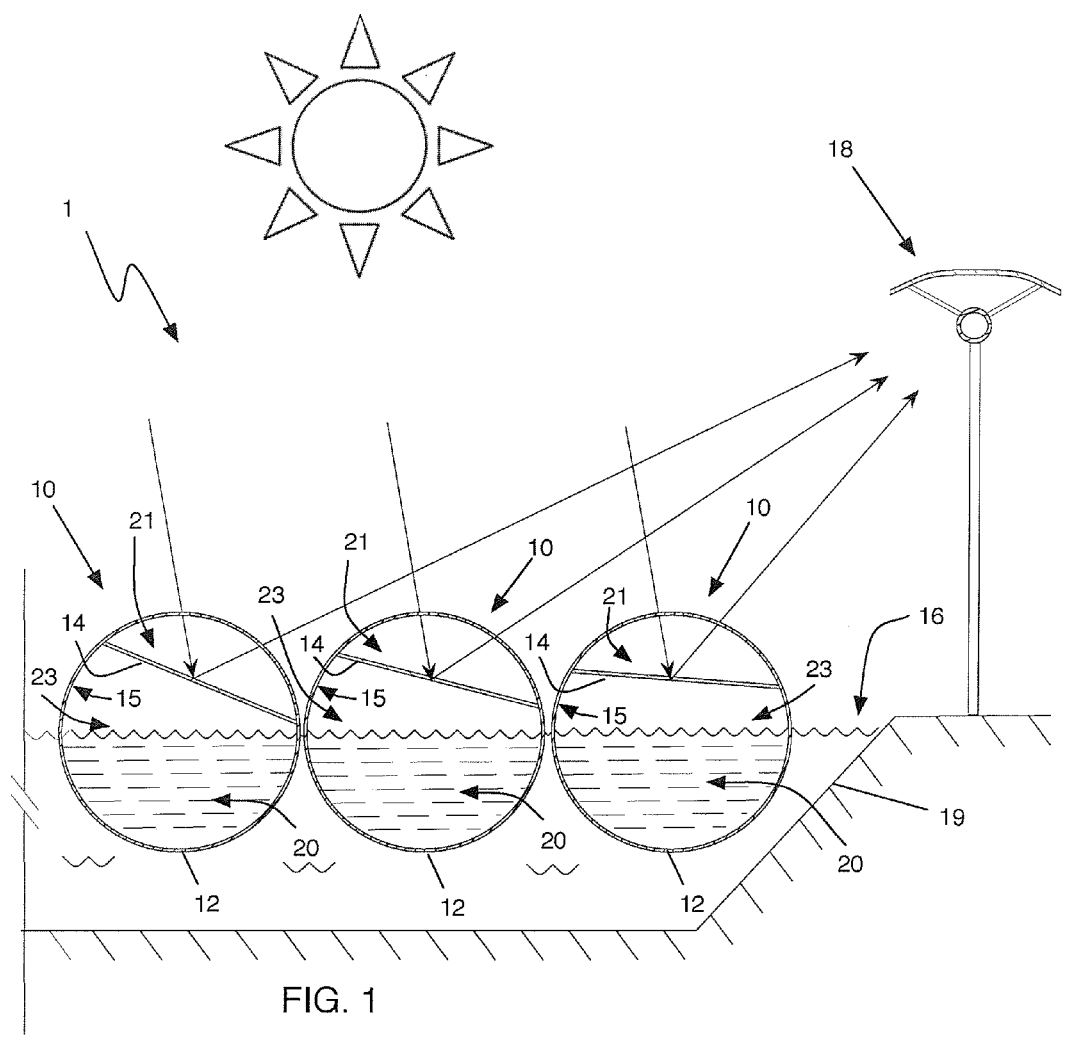
FIG. 1 is cross-sectional view of an embodiment of a solar energy collection system in accordance with the present disclosure.
Figure 2:
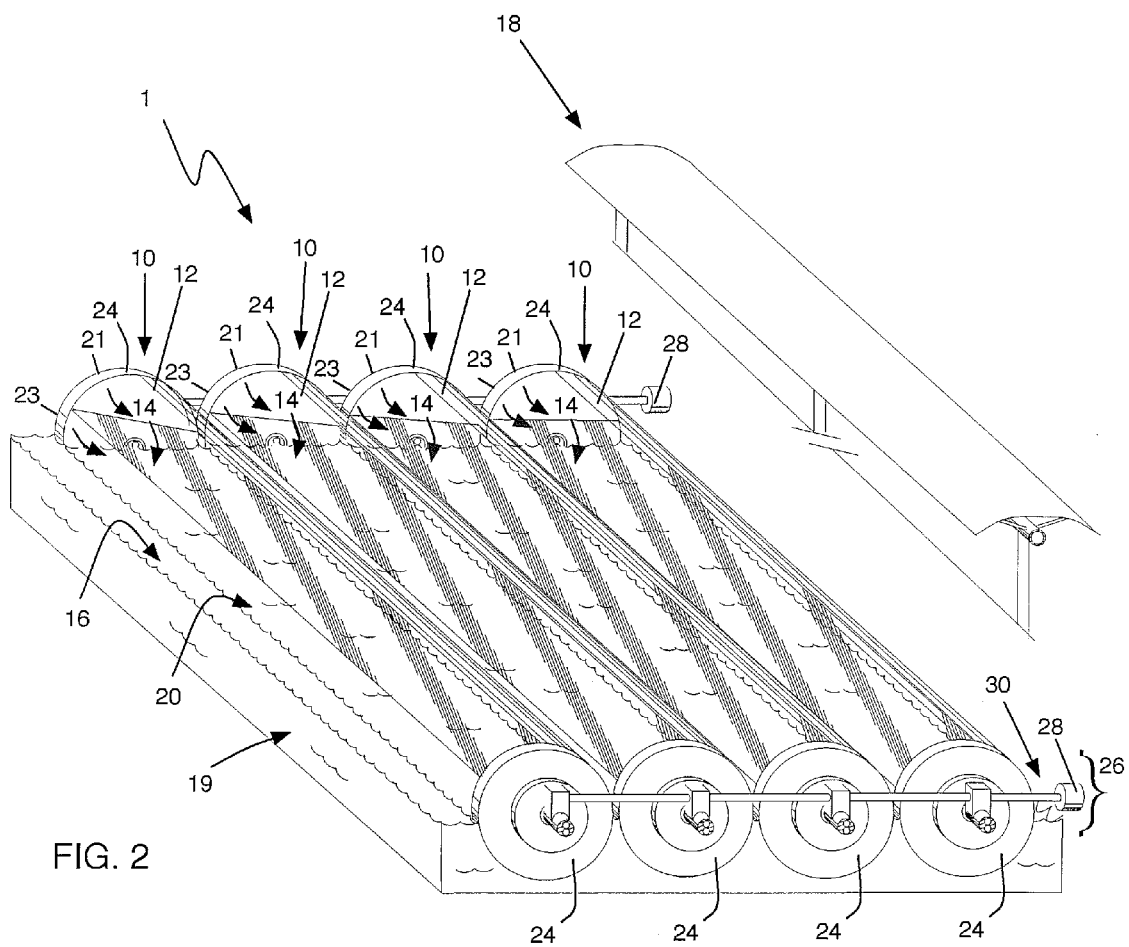
FIG. 2 is a perspective view of an embodiment of an array of solar reflector assemblies of a solar energy collection system in accordance with the present disclosure.

With reference now to the drawings, and particularly FIGS. 1 and 2, there is shown an array 1 of solar reflector assemblies 10. Each solar reflector includes an inflated elongated tube 12 having a reflective sheet 14 coupled along opposed sides of the sheet to a wall of the tube. In exemplary embodiments, reflective sheet 14 is coupled to an interior wall 15 of the elongated tube 12 so that the reflective sheet 14 divides the elongated tube 12 into two portions, an upper portion or chamber 21 and a lower ballast portion or chamber 23.

More particularly, in exemplary embodiments the elongated tube 12 is a unitary structure that includes lower ballast portion 23, which provides ballast for the solar reflector assembly 10. In other words, lower ballast portion 23 is the lower section of the elongated tube itself and, as such, is integrally formed with the elongated tube 12. This structure is advantageous because it obviates the need for additional components or structural elements to facilitate ballast. It also enables pressure differential or pressure equilibrium between the chambers 21, 23 on either side of the reflective sheet 14, as described in more detail herein. The elongated tubes may include a gas in the upper chamber 21 and a reservoir liquid 20 in the lower chamber 23 to facilitate ballast. As discussed in more detail herein, the reflective sheet could also be coupled to an exterior wall of the tube.

The solar reflectors are supported by a body of liquid 16 and are configured to rotate to direct reflected solar radiation towards a solar collector 18. The solar reflectors are used to reflect solar radiation towards a solar collector 18 configured to transform the solar energy to electricity or process heat. Beneficially, the solar reflector assemblies are inexpensive to manufacture and operate, providing a cost effective solution for electrical generation or process heat from solar energy.

Each tube 12 is formed of transparent, lightweight flexible plastic optionally coupled at each end to rigid end cap assemblies 24, which facilitate the flow of liquid and gas into and out of the tubes. Positive pressure within the tube keeps them rigid and maintains the tube in a generally cylindrical configuration having a substantially constant cross section along the length of the tube. The tube is set on an expanse of liquid 16 in a pool 19 and includes a reservoir of fluid 20 to facilitate ballast of the tube and maintain buoyancy in a prescribed manner to best track the sun, as described herein. The tubes 12 will float at a level such that the liquid level within the tube is generally even or parallel with the level of liquid 16 on which the tube is floating. More specifically, in operation the top surface of the ballast liquid is substantially parallel to the top surface of the supporting body of liquid. However, the level of liquid within the tube can vary, from empty to full with liquid, as desired.

The tubes 12 are configured in an elongated cylindrical configuration. In exemplary embodiments, the tubes are formed of a single sheet of a thin gauge, flexible material, which can be various plastics such as polyethylene, having a thickness between about 50 microns (2 mil) and 300 microns (12 mil). In other embodiments, tubes can be formed of multiple layers and multiple sections of material. In addition, other lightweight, flexible materials or combinations of materials can be used. Tubes of various sizes can be used, to include tube diameter and tube length, without departing from the disclosure. In the present embodiment, the entire tube is formed of transparent material; however, it is sufficient if an upper portion of the tube is transparent to enable solar radiation to be directed towards the reflective sheet.

The tubes can be susceptible to deterioration over time as result of exposure to solar radiation. For example, polyethylene can be susceptible to UV-B radiation, and other materials may be susceptible to other ranges of radiation. The tubes can be protected from premature deterioration using systems and methods as disclosed in the present inventor's co-pending application, U.S. application Ser. No. 12/253,962, filed Oct. 18, 2008, entitled "System and Method for Protecting Enclosure from Solar Radiation," which is incorporated by reference herein for all purposes.

With reference now to FIG. 2, the reflective sheet 14 is disposed within the elongated tube 12, having opposing longitudinal sides attached to the interior wall of the tube. The reflective sheet is formed of lightweight flexible reflective material, such as PET polyester film sold under the brand name Mylar®, available from E. I. Du Pont De Nemours & Co. Other examples of usable materials include reflective polyester film, metalized polymer film, metallic film, or other material having sufficient reflective traits while being sufficiently lightweight. In the exemplary embodiment, the reflective sheet is formed of one layer of material configured to reflect a broad wavelength spectrum. In other embodiments, the substrate film is also a polymer sheet with a reflective sheet laminated, adhesively applied, or otherwise disposed on top. In addition, multiple layers can be used, and the reflective sheet can be configured to allow prescribed wavelengths of solar radiation to pass through, while reflecting other wavelengths of solar radiation towards the solar collector.

The reflective sheet 14 can be coupled to the elongated tube 12 to enable a pressure differential to be maintained on opposing sides of the sheet. The pressure differential can be used to form the reflective sheet to a prescribed shape. For example, a higher pressure can be maintained on the upper surface of the reflective sheet such that the reflective sheet has a curved or, more preferably, a generally parabolic shape. Alternatively, the solar reflector assembly can be configured to maintain pressure equilibrium on both sides of the reflective sheet to facilitate other desired shapes for the reflective sheet. For example, the one or more end caps can be configured to allow gas to move between the upper portion and lower ballast portion of the tubes by coupling a pass-through to the upper chamber with a pass-through to the lower chamber. As discussed in more detail below, the reflective sheet can be configured to assume any number of different shapes without departing from the disclosure.

In an exemplary method of manufacture, a sheet of reflective material is attached along longitudinal side edges to a first side of a sheet of tube material at a prescribed distance from each other. Opposing longitudinal side edges of the tube material are attached to each other forming a cylinder with the reflective material disposed within the interior of the tube. The distance between the edges of the reflective material is selected to form a prescribed shape for the reflective sheet, when in use.

Figure 3:
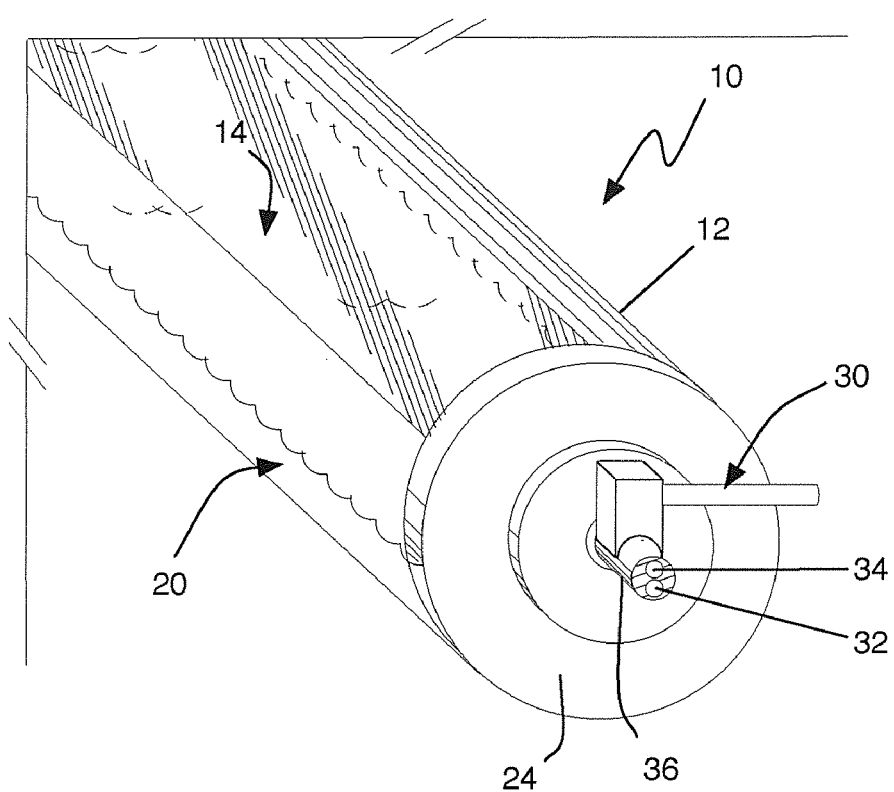
FIG. 3 is a perspective view of an embodiment of an end cap assembly coupled to a solar reflector assembly in accordance with the present disclosure.

With reference again to FIGS. 2 and 3, end cap assemblies 24 are disposed at opposing ends of the tube 12, and a rotation assembly 26 is configured to enable rotation of the tubes about a longitudinal axis oriented generally parallel to the surface of the supporting body of liquid 16. Rotation assembly 26 includes a motor 28 and a transmission system 30. The motor 28 is connected to at least one end cap assembly 24 by the transmission system 30. The motor 28 provides power to turn the tube 12 either way. It is possible to drive both ends of the tube 12 by installing motors and transmission systems at both ends. The tubes can be turned to track the sun to optimize reflection of solar radiation onto the solar collector. In other embodiments, longitudinal bladders can be built into the tubing material or otherwise used to support the tubes. Air pressure varied within said bladders can be used to change the buoyancy of one side of the tube, causing rotation until equilibrium is reached.

Each end cap assembly 24 is configured to facilitate flow of gas and liquid to and from the interior of the elongated tube 12. To that end, end cap assembly 26 may include liquid transfer tubes 32 and gas transfer tubes 34 that extend from the end caps. Liquid can be injected or withdrawn through liquid transfer tubes to regulate how high the elongated tubes 12 float in the support liquid 16. Similarly, gas can be injected or withdrawn through gas transfer tubes. The inlets and outlets pass through pipes 36, which also serve as axles on which end-caps rotate. By passing through the axis of rotation of the end-caps, the liquid and gas transfer tubes can thus be permanently interfaced to the elongated tube 12 and can allow fluid and gas transfer while the elongated tube is turning. However, other inlets and outlets passing through both, eccentrically mounted control valves on the end-cap, or valves mounted on the plastic tubing itself are possible in other embodiments without departing from this disclosure.

In exemplary embodiments, the liquid transfer tubes 32 are submerged within the liquid 20 within the tube. Gas transfer tubes 34 are disposed above the liquid. In other embodiments, various other configurations can be used. One liquid and one gas transfer tube passing through each end-cap are used. It is also possible to have more than two transfer tubes passing through each end-cap. In exemplary embodiments, the rotation element includes sealed ball bearings, which enable long life of the assembly despite potential prolonged exposure to moisture. There are multiple methods possible for sealing the ends of the tubes.

The solar energy collection system can include an array of solar reflector assemblies configured to reflect solar radiation towards multiple solar collectors. For example, the system can include groupings of solar reflectors disposed on opposing sides of linear solar collectors, and the solar reflectors can be directed to the closest solar collector.

Figure 5:
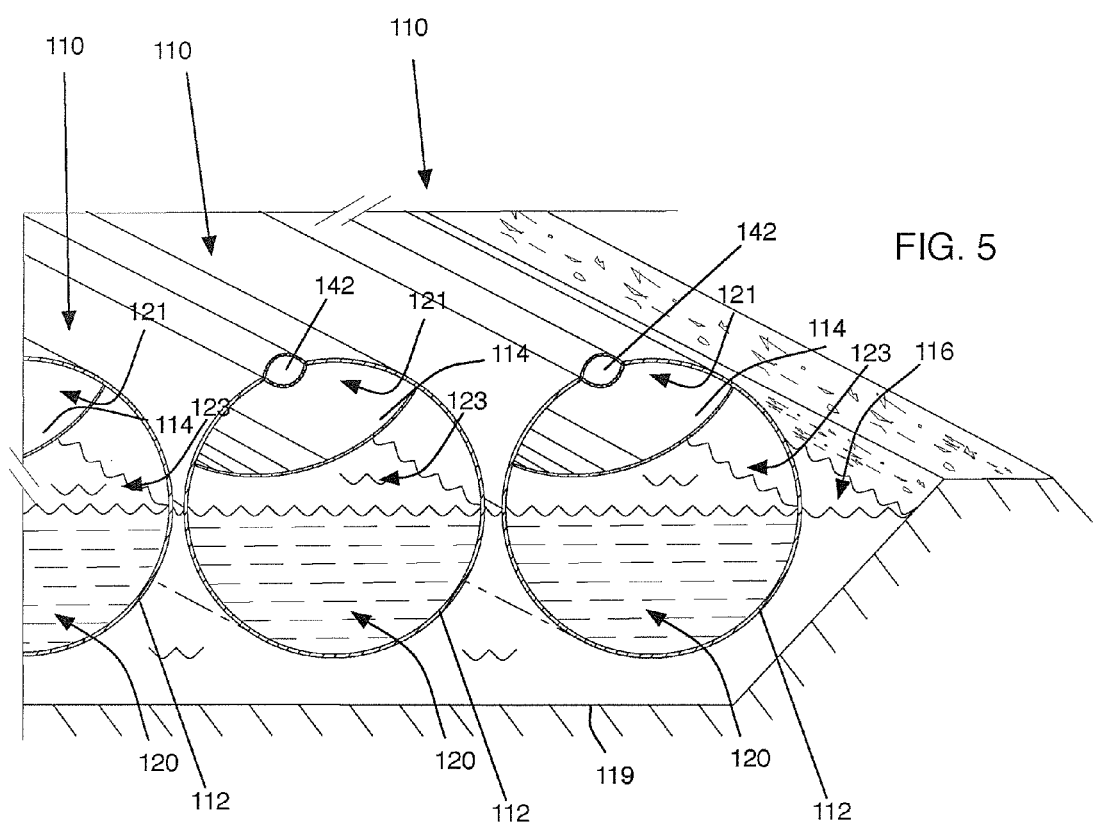
FIG. 5 is a cross-sectional, perspective view of an embodiment of an array of solar reflector assemblies in accordance with the present disclosure.
Figure 6:
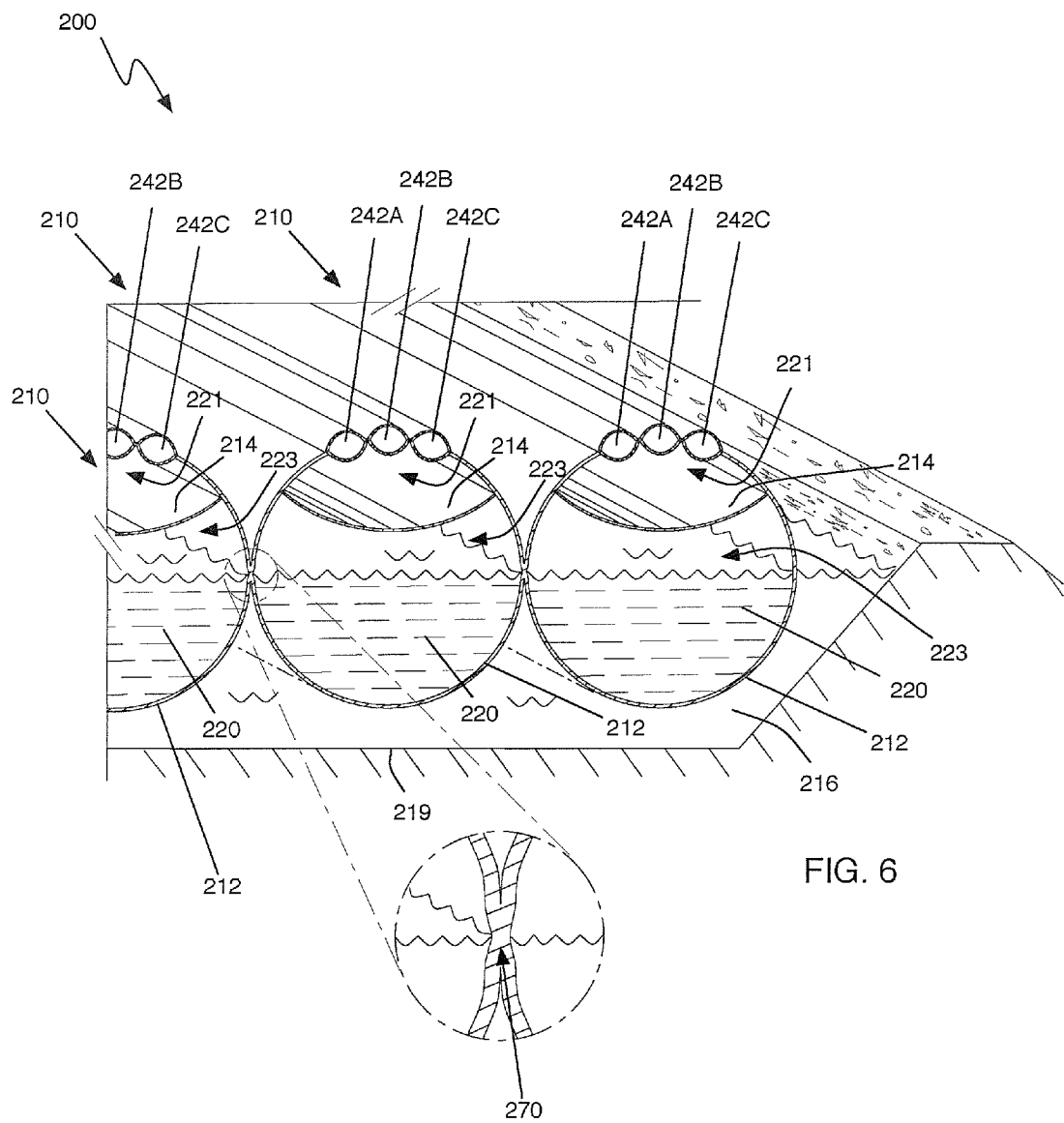
FIG. 6 is a cross-sectional view of an embodiment of an array of solar reflector assemblies in accordance with the present disclosure.

With reference now to FIGS. 4 and 5, a solar reflector assembly 110 is shown having a heat-transfer reservoir 142 positioned above a reflective sheet 114 such that solar radiation reflected by the sheet is directed towards the reservoir. More particularly, the reservoir is in an upper portion of the elongated tube 112, extending the entire length of the tube. Heat-transfer fluid enters a heat-transfer reservoir 142 at a first end cap, and it absorbs the reflected solar radiation from the reflective sheet 114 of the solar reflector assembly 110 as it passes through the heat-transfer reservoir 142 to a second end cap assembly. The heated fluid is then directed to power an electrical generator (not shown) or is used for process heat. Reflective sheet 114 is coupled to an interior wall of the elongated tube 112 so that the reflective sheet 114 divides the elongated tube 112 into two portions, an upper portion or chamber 121 and a lower ballast portion or chamber 123. An array of solar reflectors 110 can be configured to rotate to track the sun to ensure that the reflective solar radiation is directed towards the reservoir, as in FIG. 5. The solar reflector assemblies 110 are supported by a body of liquid 116 in a pool 119.

In exemplary embodiments, the heat-transfer reservoir 142 is attached to or formed in the wall of the elongated tube from the same polymer material. For example, an exterior and an interior sheet of polymer material can be used together by spaced apart, generally parallel seams to form the heat-transfer reservoir. The material for the heat-transfer reservoir should have sufficient strength and durability characteristics to handle the anticipated pressure, heat, and so on, when the heat-transfer fluid is heated.

In other embodiments, the heat-transfer reservoir can include additional structure and/or other materials, to facilitate the use of selected heat-transfer fluids that achieve high pressures and high temperatures. For example, the heat-transfer reservoir as discussed above can further include a rigid tube installed at tube deployment, sandwiched between the exterior and interior sheets and extending between the end cap assemblies.

With reference now to FIGS. 6 and 7a-c, an array 200 of solar reflector assemblies 210 is shown. Each solar reflector assembly 210 includes a tube 212 having a plurality of heat-transfer reservoirs 242a-c, similar to the heat-transfer reservoir depicted in FIG. 4. A reflective sheet 214 is disposed within each tube 212. The elongated tubes 212 are coupled together along longitudinal sides 270, forming a raft. A raft configuration can be used in other embodiments, such as with an external solar collector that can be disposed in a prescribed location, spaced apart from the raft to receive reflected solar radiation from the reflective sheets.

Use of a plurality of heat transfer reservoirs can be effective in embodiments in which the solar reflector assembly does not rotate to track the sun. Rather, as the sun progresses across the sky, the reflected focal area of the reflective sheet will track across the plurality of heat transfer reservoirs. The system can be configured to pass the heat-transfer fluid through the appropriate reservoir at prescribed times to coincide with the location of the reflected focal area.

Figure 7C:
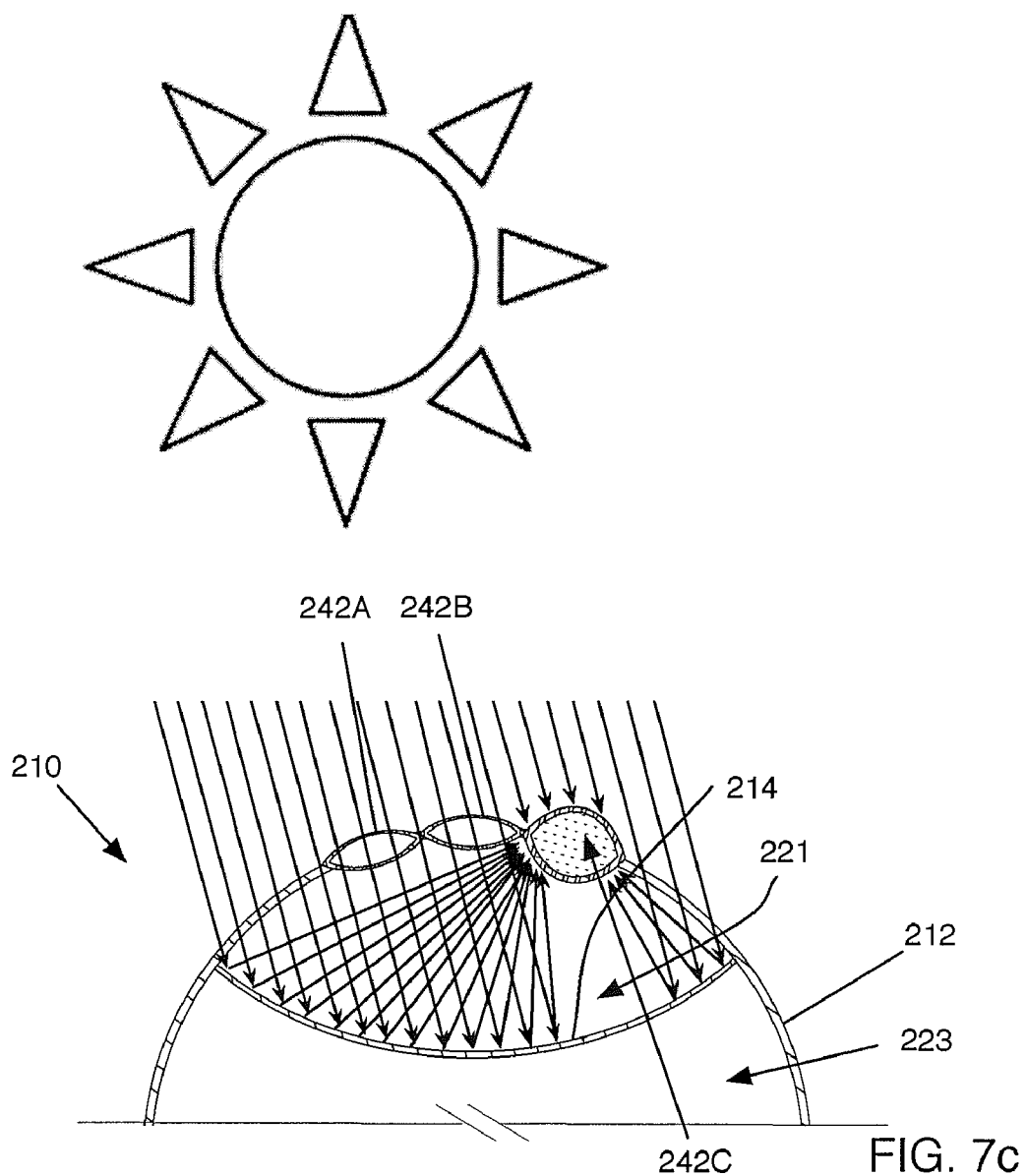

For example, as shown in FIG. 7a, the system passes heat-transfer fluid through the first reservoir 242a in the morning. During midday, the system passes heat transfer fluid through the center reservoir 242b (FIG. 7b). In the afternoon, the system passes heat transfer fluid through the third reservoir 242c (FIG. 7c). In other embodiments, the system can be designed with any number of heat-transfer reservoirs, and the size and configuration of each reservoir of the plurality of reservoirs can vary from each other, as requirements dictate.

Figure 8A:
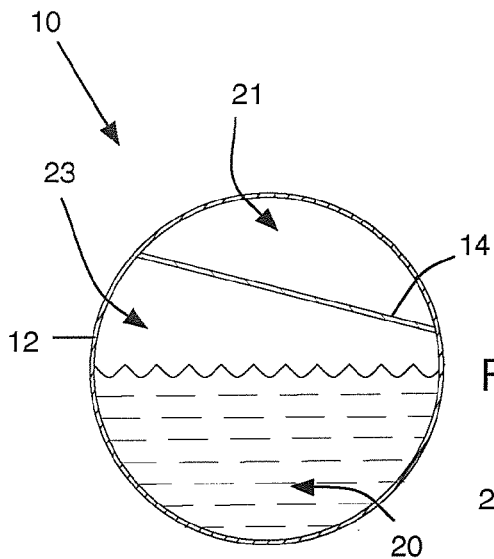
FIGS. 8a-c are cross-sectional views of embodiments of solar reflector assemblies in accordance with the present disclosure.
Figure 8B:
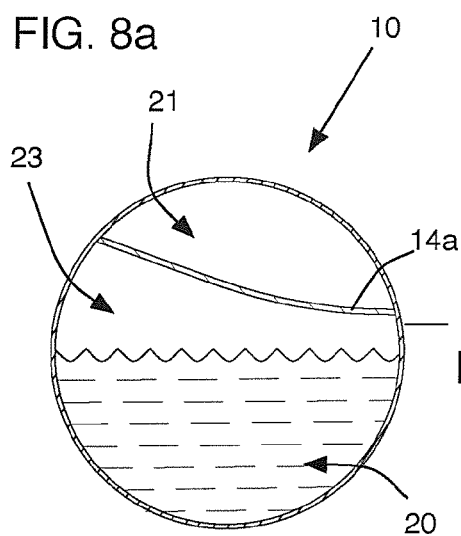
Figure 8C:
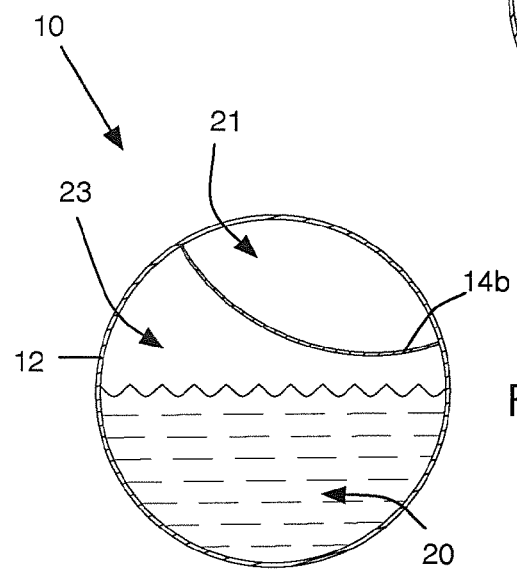

With reference now to FIGS. 8a-c, the reflective sheet 14 can be configured to achieve various different shapes. For example, as in FIG. 8a, the reflective sheet 14 can be configured to be held taut when the tube is inflated, forming a generally planar shape. Alternatively, as in FIGS. 8b, c, a curved shape for the reflective sheet 14a, 14b can also be used. The reflective sheet 14a can be configured to drape between the attachment seams of the opposing longitudinal edges of the reflective sheet, forming a generally catenary shape (FIG. 8b). Alternatively, as in FIG. 8c, the curved shape can be formed by maintaining a pressure differential on opposing sides of the sheet 14b, forming a generally parabolic shape. Nonetheless, other shapes for the reflective sheet can be used without departing from the disclosure.

Figure 9A:
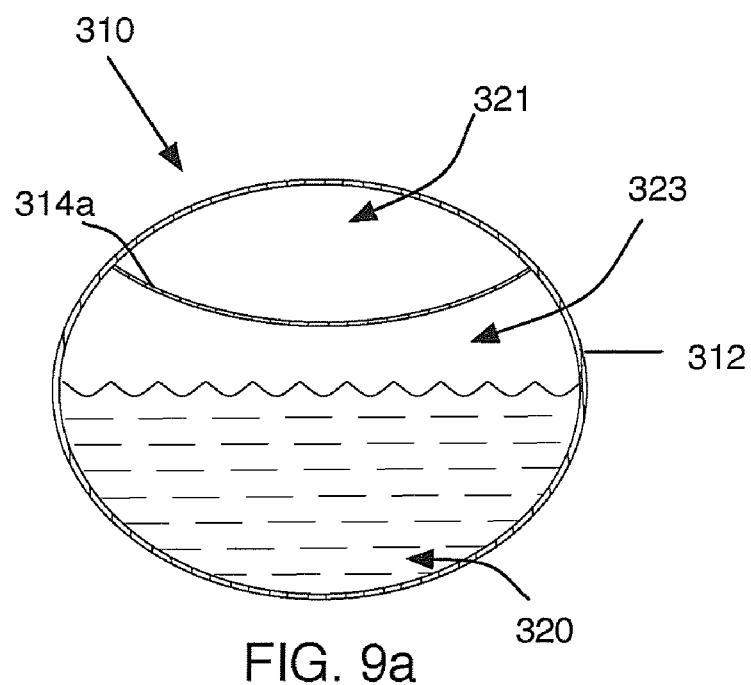
FIGS. 9a-b are cross-sectional views of embodiments of solar reflector assemblies in accordance with the present disclosure.
Figure 9B:
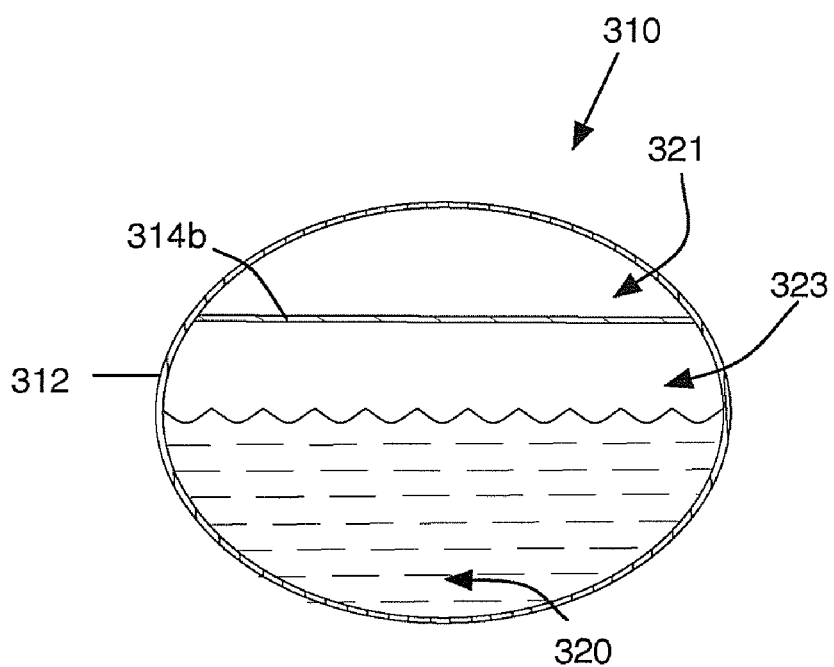

With reference now to FIGS. 9a-b, the elongated tube 312 of the solar reflector assembly 310 can be configured to achieve various different cross-sectional shapes. In each example depicted, the tube 312 has a generally constant cross-section profile. In other embodiments, the cross-section profile can vary across the length of the tube. FIG. 9a depicts an elongated tube 312 having an oval shaped cross section, used with a curved reflective sheet 314a. FIG. 9b depicts an elongated tube 312 having an oval shaped cross section, used with a planar reflective sheet 314b. It should be appreciated that variations of these shapes and others having different parameters can be used. In addition, other cross-sectional shapes for the tube can be used, such as an ellipse, superellipse, vesica piscis, lens, and polygon, to name a few, without departing from the disclosure.

Various approaches for manufacture can be used. For example, the tube can be formed by an upper panel and a lower panel, along opposing seams, and the reflective material is disposed therebetween attached at the seam. The tube can also be formed by a single sheet of material to which the reflective sheet is attached. The opposing ends of the sheet can be coupled together forming the tube, having the reflective sheet disposed in the interior. Due to the flexibility of the material it can be rolled up into a compact format for shipping and deployment.

Figure 10:
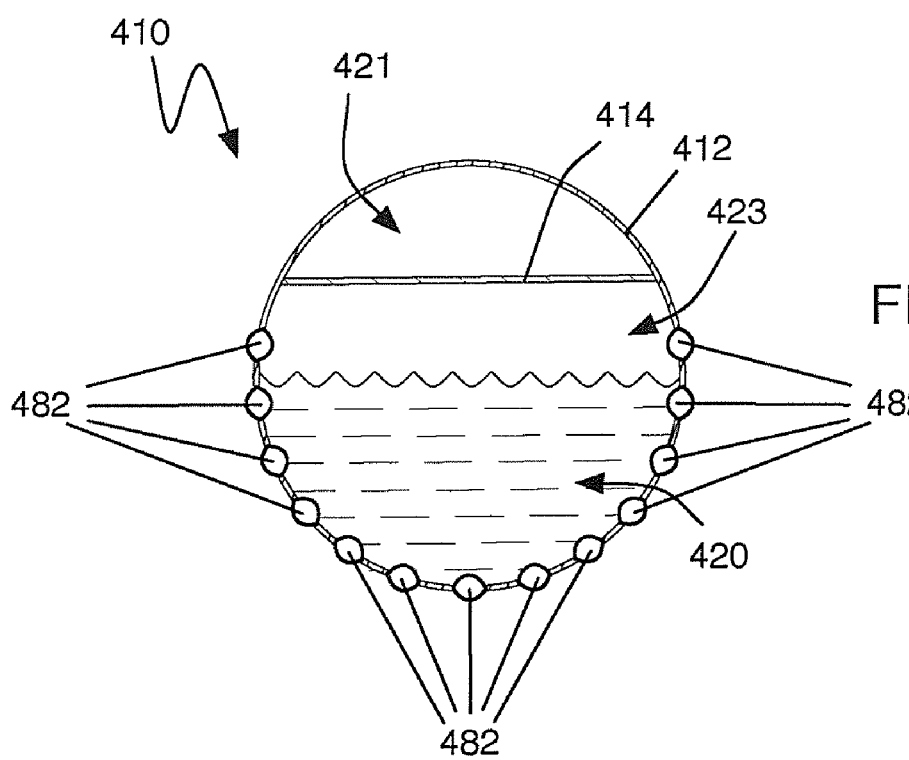
FIG. 10 is a cross-sectional view of an embodiment of a solar reflector assembly in accordance with the present disclosure.

With reference now to FIGS. 10 and 11, a solar reflector assembly 410 is shown having gas bladders 482 that extend the length of the tube 412. Each gas bladder is independently controlled with a regulator valve manifold assembly 486, to optimize the stability of the system. An array of solar reflectors 410 can be used together, in which a subset of the tubes can be inflated with the other tubes partially or completely deflated to control the angle at which the tubes float in the supporting body of liquid (not shown). The assembly can incorporate similar features as discussed with reference to other embodiments, including end cap assemblies 424, reflective sheet 414, gas and liquid pass-through tubes 432, 434, a rotation assembly 426 including a motor (not shown) and a transmission system 430 and so on.

Turning to FIGS. 12-14, exemplary embodiments of a solar reflector assembly with an externally mounted reflector will be described. With reference now to the drawings, and particularly FIG. 12, there is shown a solar reflector assembly 510 including an inflated elongated tube 512 and a reflective sheet 514 coupled to an exterior wall 517 of the tube, usable as a solar reflector and/or a photobioreactor, in which the tube is disposed on a supporting body of liquid (not shown). The reflective sheet 514 is disposed along the top of the tube 512.

Supports 525 are disposed on an exterior side 517 of the tube 512. The longitudinal sides of the reflective sheet 514 are coupled to the supports 525 and an intermediate section of the reflector sheet 514 can be coupled to the tube 512, such that the reflective sheet 514 is generally flat. The elongated tube 512 has an upper portion 521 and a lower ballast portion 523 containing reservoir liquid 520, though the upper and lower ballast portions are not physically separated because of the external location of the reflective sheet 514. In exemplary embodiments, the elongated tube 512 is a unitary structure that includes lower ballast portion 523, which provides ballast for the solar reflector assembly 510. In other words, lower ballast portion 523 is the lower section of the elongated tube itself and, as such, is integrally formed with the elongated tube 512. This structure is advantageous because it obviates the need for additional components or structural elements to facilitate ballast. The elongated tube 512 is made of a thin-gauge, flexible material, as described in more detail above, and, in contrast to other embodiments, need not be transparent because the reflective sheet 514 is externally mounted.

With reference now to FIG. 13, a second embodiment is shown in which the reflector sheet 514 is positioned and attached in a similar manner as in FIG. 12. However, the longitudinal sides 527a, 527b of the reflector sheet 514 are raised relative to the intermediate section 529 of the sheet 514, such that the reflected solar radiation can be focused. More particularly, the reflective sheet 514 is mounted to have a generally v-shaped cross section. In other embodiments, the reflective sheet 514 can be mounted to have various other cross-sectional shapes such as u-shaped or parabolic, among others.

In the exemplary embodiments of FIGS. 12 and 13, the supports 525 are formed as inflatable tubes similar to the primary tube 512. The supports 525 are formed of a single sheet of plastic such as polyethylene, having a thickness between about 50 microns (2 mil) and 300 microns (12 mil). In other embodiments, the supports 525 can be formed of multiple layers and multiple sections of material. In addition, other lightweight, flexible materials or combinations of materials can be used for the supports.

The supports 525 of the exemplary embodiments are independently inflatable relative to each other and the primary tube 512. Alternatively, the supports 525 can be operatively coupled to each other and/or to primary tube 512 to enable air to pass between the components to maintain air pressure therein.

In the exemplary embodiments of FIGS. 12 and 13, the supports 525 have a generally circular cross section. In other embodiments, the supports 525 can have other cross-sectional shapes, to facilitate other shapes for the reflective sheet 514 such as a parabolic shape. In addition, the supports 525 run substantially the entire length of the tube 512. In other embodiments, multiple supports 525 can be used and can be intermittently spaced along the length of the tube 512. Moreover, the supports 525 need not be inflatable. Rather, other structure can be used to maintain the reflective sheet 514 in the proper position.

With reference now to FIG. 14, a rigid reflector sheet 514 is disposed tangentially along the top of the tube 512. The rigid reflector 514 is supported by its connection to the tube 512 and its rigidity. The reflector 514 can be formed of reflective material mounted on a rigid base sheet. In the present embodiment, the base sheet is formed of rigid polyvinyl chloride (RPVC) having a thickness between about 200 and 300 microns. Other exemplary materials that can be used include thermoplastic polymers and other materials having rigidity sufficient to maintain a prescribed cross-sectional geometry independent of lateral supports 525. The rigid reflector 514 can be rolled up for storage or transport, and yet configured to remain relative flat when deployed.

An externally mounted reflector sheet can also be used in embodiments described above in which a plurality of elongated tubes are coupled together along longitudinal sides, forming a raft, as well as with embodiments having gas bladders that extend the length of the tube(s).

Figure 15:
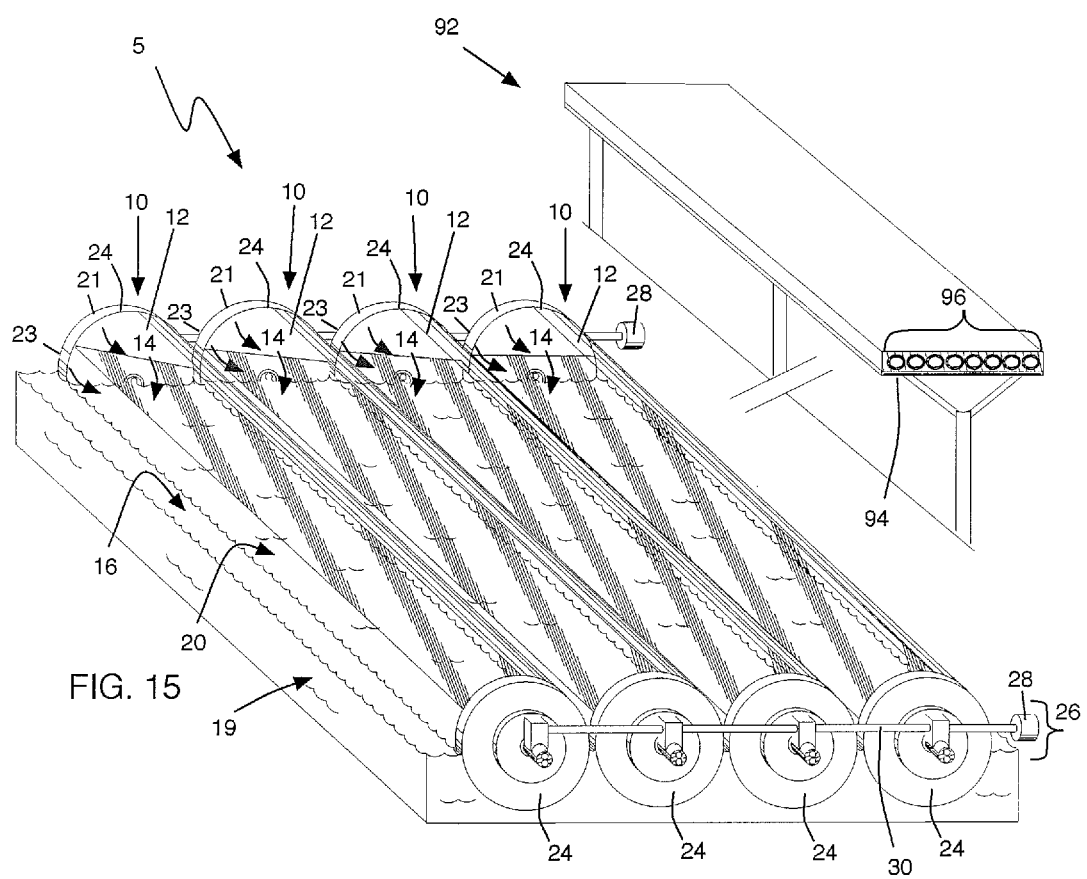
FIG. 15 is an embodiment of a solar energy collection system in accordance with the present disclosure.
Figure 16:
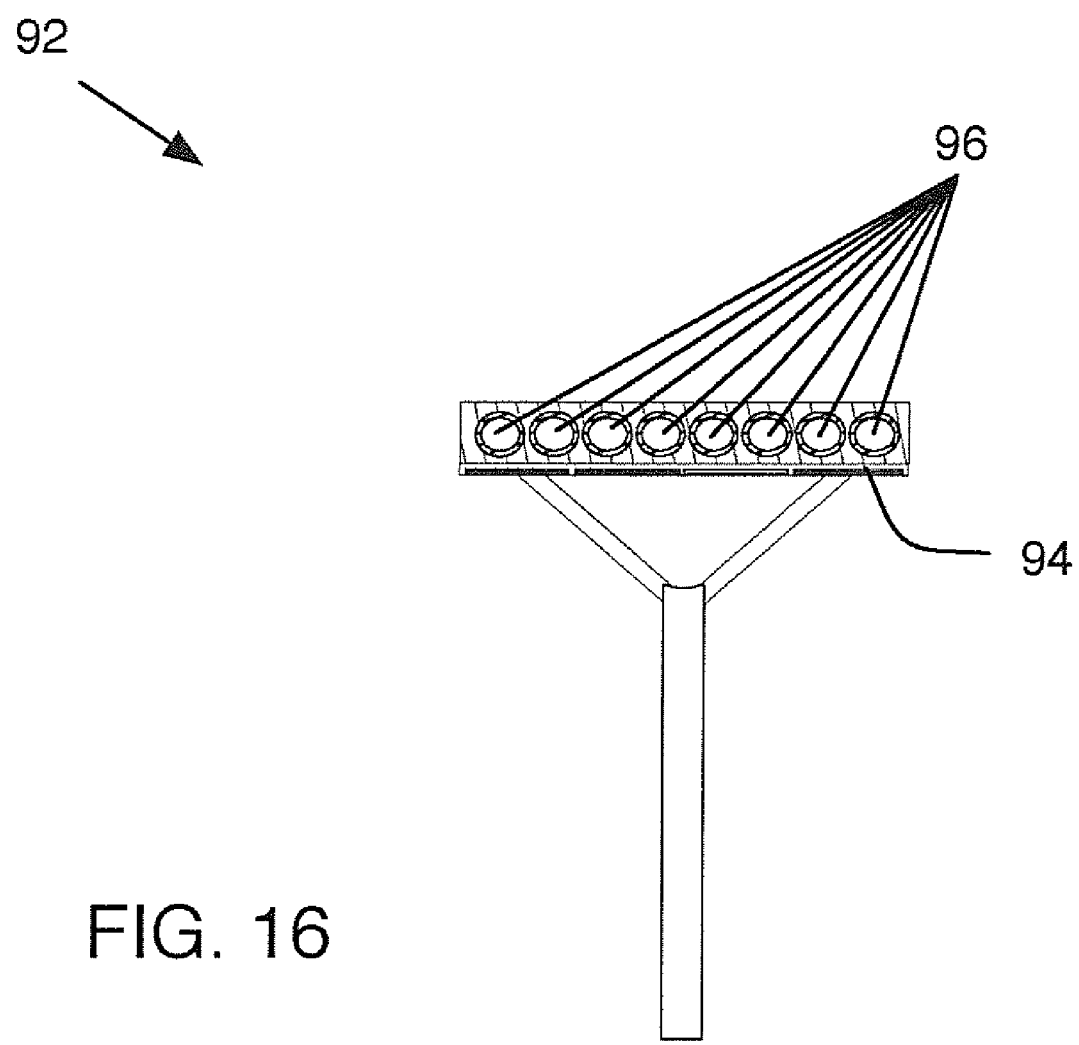
FIG. 16 is a cross-sectional view of a solar energy collection system in accordance with the present disclosure.

Turning to FIGS. 15 and 16, a system 5 of generating energy from solar radiation is shown, having a solar collector 92 that includes solar PV cells 94 disposed below heat-transfer pipes 96. The PV cells are configured to receive energy from reflected radiation within a prescribed wavelength, such as the visible light spectrum. The solar reflectors concentrate reflected radiation on the PV cells, thereby optimizing efficiency. The heat-transfer pipes are used to pass heat-transfer fluid as discussed above. Beneficially, the pipes are positioned to absorb reflected radiation from the solar reflectors as well as serving as a heat sink for the PV cells, cooling the PV cells and keeping them in an optimal heat range to minimize risk of overheating. In an alternate embodiment, thermoelectric modules (using, e.g., the Seebek effect) could be substituted for the PV cells. The heat-transfer fluid can capture the IR portion of the reflected radiation, thereby collecting heat for use in a generator. Once heated, the heat-transfer fluid can be used to generate energy as known in the art, such as electricity or process heat (as discussed above). As in previously discussed embodiments, the solar reflector assemblies 10 includes an elongated tube 12 having an upper portion 21 and a lower ballast portion 23 containing a reservoir liquid 20, a reflective sheet 14, end cap assemblies 24 and rotation assembly 26. The solar reflector assemblies 10 are supported by a body of liquid 16 in a pool 19 and rotate to direct reflected solar radiation to solar collector 92.

Figure 17:
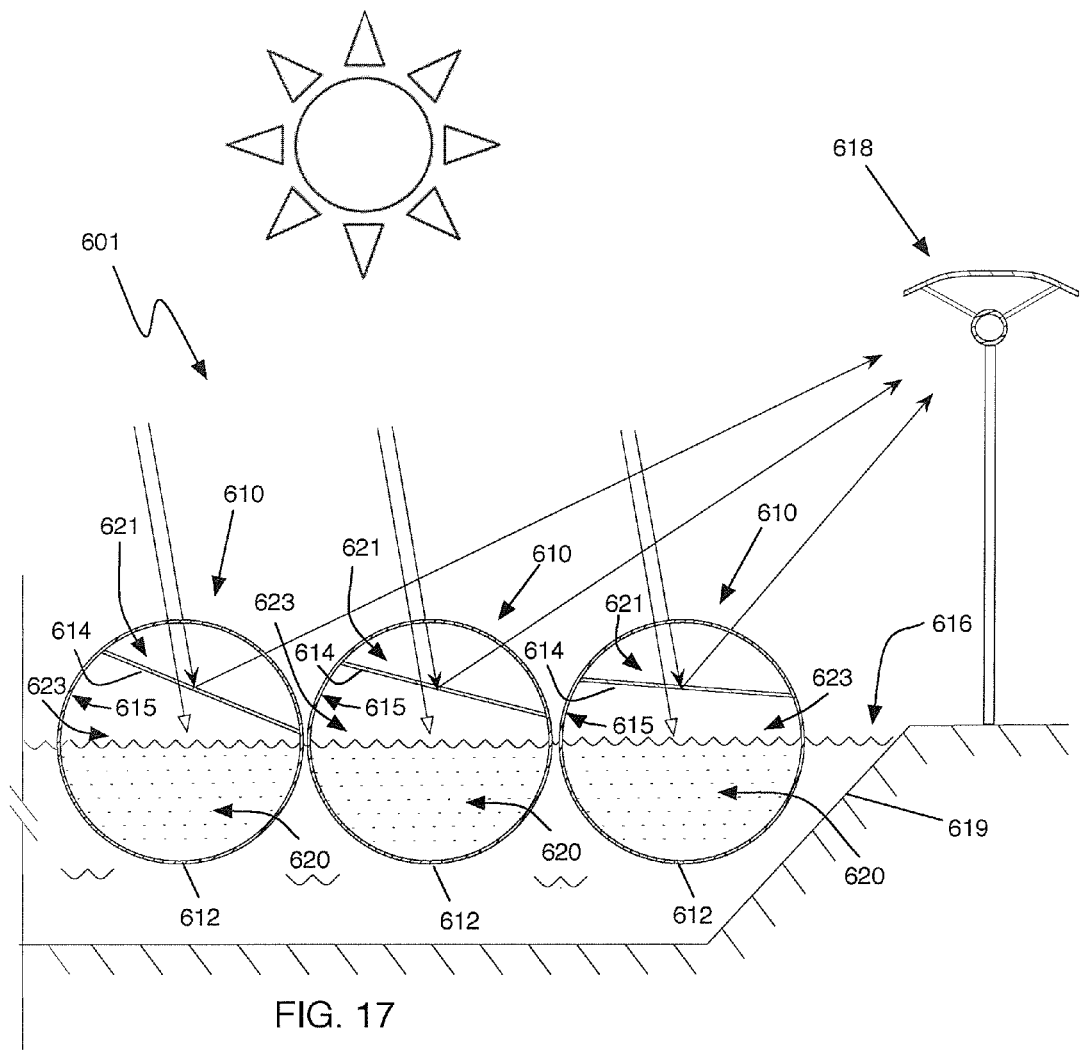
FIG. 17 is a cross-sectional view of an embodiment of a concentrated solar power/photobioreactor assembly in accordance with the present disclosure.
Figure 18:
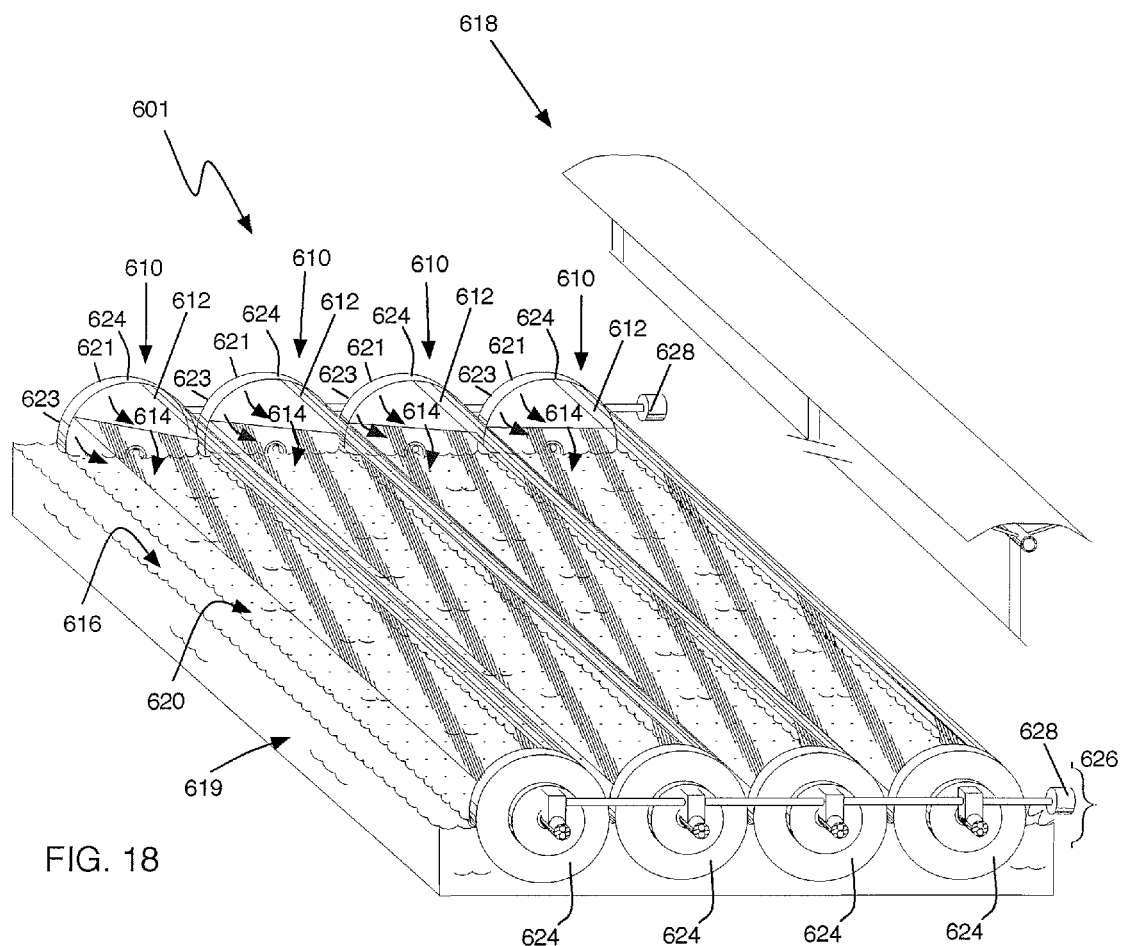
FIG. 18 is a perspective view of an embodiment of an array of concentrated solar power/photobioreactor assemblies in accordance with the present disclosure.

In each of the forgoing configurations, the reflective sheet can be fully reflective, such as when used for embodiments configured only as a solar reflector. Alternatively, the reflective sheet can be configured as a hot mirror, as disclosed in the U.S. Patent Application Ser. No. 61/233,667, filed Aug. 13, 2009, which is incorporated by reference herein in its entirety, and described herein, for embodiments configured for biomass generation or for a combined solar reflector and photobioreactor assembly ("CSP/PBR assembly"). It should be noted that in exemplary embodiments employing both internal and exterior mounting of the reflective sheet, the tube material is at least partially translucent such that biomass may grow in the ballast fluid in the lower ballast portion of the tube. In addition, biomass may grow in the pools of support liquid. This biomass could be harvested and processed into a useful product In exemplary embodiments the reservoir of liquid within the tubes can also be used to grow biomass using systems and methods as disclosed in U.S. Patent Application Ser. No. 61/152,949, filed Feb. 16, 2009 ("'949 Application"), which is incorporated by reference herein in its entirety. With reference now to the drawings, and particularly FIGS. 17 and 18, there is shown an array 601 of concentrated solar power/photobioreactor assemblies 610 ("CSP/PBR assemblies"). Each CSP/PBR assembly 610 includes an inflated elongated tube 612 having a reflective sheet 614 coupled along opposed sides of the sheet to an interior wall 615 of the tube. Thus, the tube 612 is divided into an upper portion 621 and a lower ballast portion 623.

The reflective sheet is configured to reflect IR radiation towards a solar collector 618, while allowing visible light to pass through to a culture medium 620 within the lower ballast portion 623 of the tube 612. The array is supported by a body of liquid 616 in a pool 619.

The reflective sheet 614 is formed of lightweight flexible reflective material configured to allow prescribed wavelengths of solar radiation to pass through, while reflecting other wavelengths of solar radiation towards the solar collector 618. In exemplary embodiments, the reflective sheet is formed as a hot mirror, configured to reflect IR radiation (e.g., heat reflective) while allowing visible light to pass through (e.g., visibly transparent), across wide angles of incidence. Thus, IR radiation is reflected towards the solar collector, while the visible light passes through to the culture medium 620 to facilitate growth of the biomass, e.g., algal biomass. Moreover, minimizing penetration of IR radiation into the culture medium reduces the heat load of culture, allowing the culture to be maintained at a temperature conducive to optimal biomass growth. It should be noted that in this and other exemplary embodiments some tubes could be deployed with hot mirrors and some with full spectrum reflectors, in order to finely tune the percentage of insolation that makes it into culture to generate biomass, and how much insolation is reflected to the receiver for power generation.

The term "visibly transparent," unless otherwise specified, is intended to refer to an attribute of the reflective sheet of transmitting a large fraction (e.g., an average of at least 50%) of visible radiation (e.g., at least between about 400 nm to about 700 nm) therethrough. The term "heat reflective," unless otherwise specified, is an attribute of the reflective sheet of reflecting a large fraction (e.g., an average of at least 50%) of IR radiation (e.g., above 750 nm).

In exemplary embodiments, the reflective sheet 614 comprises a dielectric thin film disposed on a flexible substrate, such as a flexible polymeric sheet. For example, the reflective sheet 614 can include flexible films such as IR reflective films sold under the brand name Prestige™ Series, available from 3M Company. The reflective sheet 614 is further configured to endure a high moisture environment, without significant deterioration. The dielectric film can comprise one or more layers (or stacks) disposed on the substrate. In multi-layer configurations, the thickness of each of the layers can be selected to optimize the properties of the reflective sheet. Moreover, intervening layers having varying properties can be used to optimize performance of the reflective sheet. In other embodiments, the reflective sheet can comprise other materials, known in the art, having sufficient characteristics for use in the intended purposes, such as metal oxides disposed on a substrate. Suitable substrates can include standard contractor-grade low-density polyethylene (LDPE), polyethylene terephthalate (PET) (e.g., uniaxial, biaxial), polyester, polyterephthalate esters, polyethylene naphthalate, polypropylene, and others.

In exemplary embodiments, the reflective sheet 614 is configured to be visibly transparent and heat reflective across a wide range for the angle of incidence of solar radiation, (e.g., 0 degrees to at least 60 degrees). At very high angles of incidence, the reflective sheet may behave more like a full spectrum reflector. As discussed below, the assembly can be configured to rotate to track the sun such that the reflective sheet 614 can be optimized for operation with a tight range for the angle of incidence of solar radiation (e.g., ±20 degrees).

As shown in FIG. 19*a*, end cap assembly 624 may include liquid transfer tubes 632 and gas transfer tubes 634 that extend from the end caps. Liquid can be injected or withdrawn through liquid transfer tubes to regulate how high the elongated tubes 612 float in the support liquid 616. Similarly, gas can be injected or withdrawn through gas transfer tubes. The inlets and outlets pass through pipes 636, which also serve as axles on which end-caps rotate.

Figure 19B:
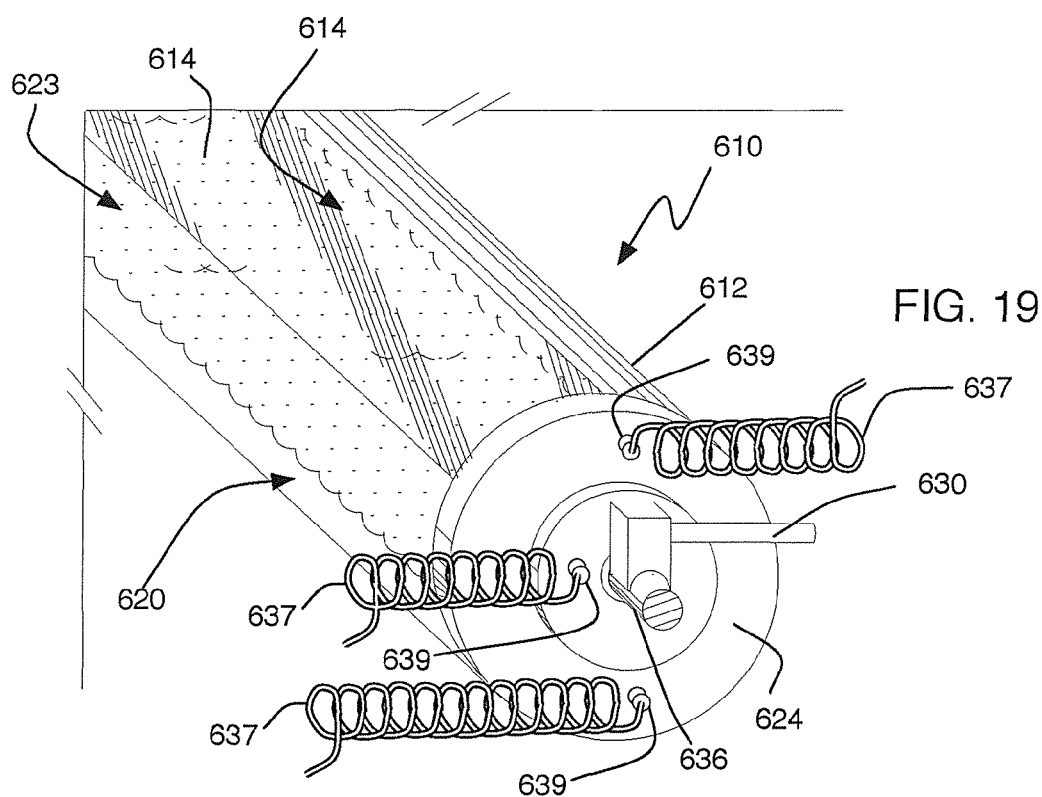
FIG. 19b is a perspective view of an embodiment of an end cap assembly having pass-throughs and coupled to a concentrated solar power/photobioreactor assembly in accordance with the present disclosure.

The end cap assembly 624 may also comprise eccentrically mounted pass-through fittings 639 instead of transfer tubes, as shown in FIG. 19*b*. Pass-through fittings 639 provide access to the inside of the tube 612 to facilitate flow of gas and/or liquid into and out of the tubes through fluid lines 637.

Figure 20:
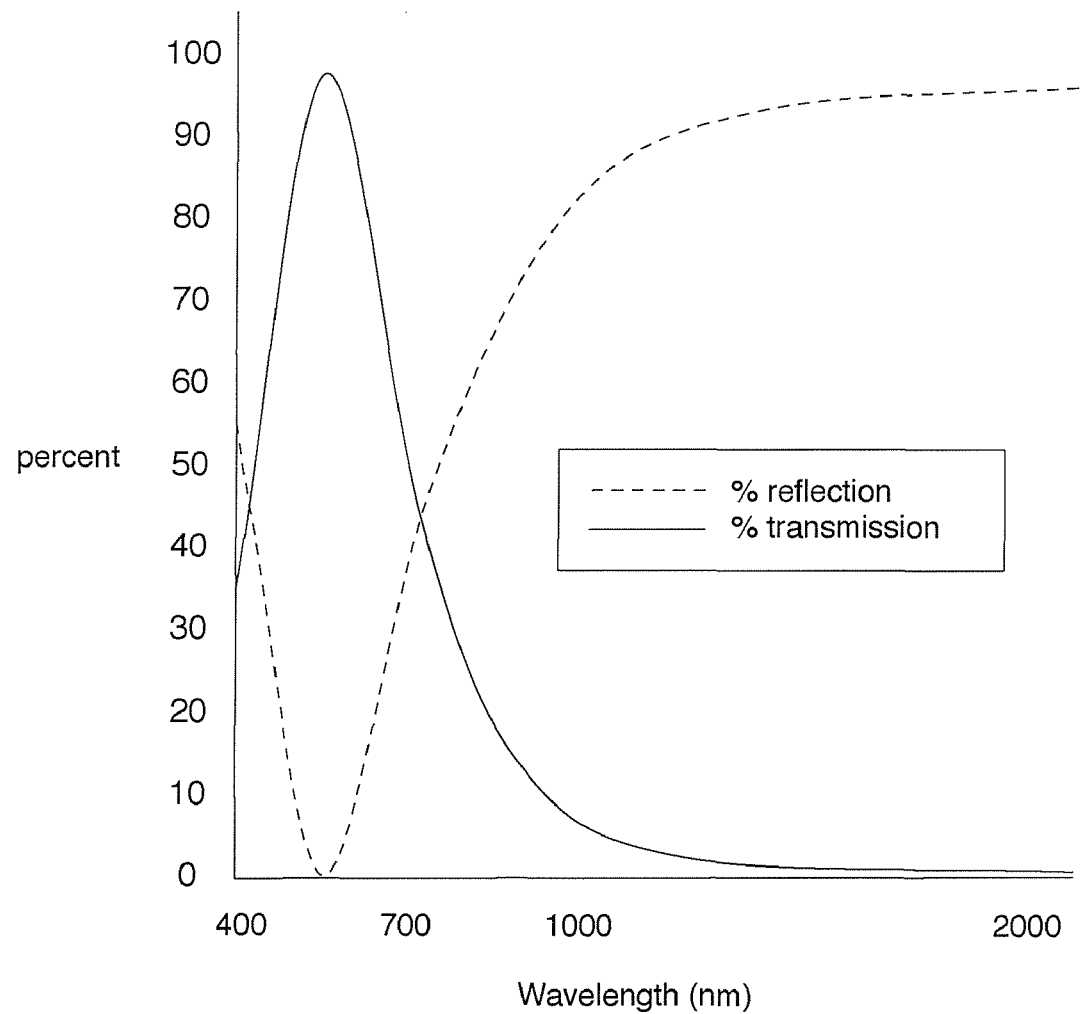
FIG. 20 is a graph depicting percent transmittance at zero degrees incidence, as a function of wavelength, for an exemplary embodiment of a reflective sheet for a reflector/photobioreactor assembly in accordance with the present disclosure.

With reference now to FIG. 20, a chart is shown, depicting the transmission percentage across a wavelength spectrum for an exemplary embodiment of a reflective sheet at a normal angle of incidence. In this chart, the x-axis shows wavelength in nanometers (nm), and the y-axis shows percent of incident energy reflected or transmitted. The solid line represents the percent transmission, while the dashed line represents the percent reflection. In this exemplary Configuration, the reflective sheet is configured to allow substantial transmission of wavelengths between about 400 nm and 700 nm and to substantially reflect wavelengths between above 750 nm. More particularly, the reflective sheet allows transmittance of at least 50 percent of incident energy in the wavelength band between about 400 nm and 700 nm at normal incidence. Moreover, over 80 percent of the solar radiation between 500 nm and 600 nm passes through the reflective sheet to radiate the culture medium. Meanwhile, above 700 nm, the reflective sheet becomes highly reflective, even at normal incidence.

In other embodiments, the reflective sheet can be configured to varied parameters for reflection and transmission performance. For example, the reflective sheet can be configured to achieve higher levels of transmittance within the visible spectrum, particularly within wavelengths to optimize photosynthesis (e.g., between about 380 nm-420 nm, at the lower end, and about 690 nm-750 nm, at the upper end). In yet other embodiments, the reflective sheet can be configured for high transmission (e.g., above 50 percent) for a range (or ranges) within the visible spectrum, such as, between about 400-500 nm and/or about 600-700 nm. Such ranges can be selected based on the needs of an algal culture of a prescribed embodiment.

The reflective sheet's performance parameters as a heat reflector can also be varied across embodiments without departing from the disclosure. For example, it is contemplated to configure the reflective sheet to have a high percentage of reflection for substantially all incident solar IR radiation above about 700 nm or, in other embodiments, above about 750 nm. More particularly, the reflective sheet reflects at least 50 percent of incident energy at wavelengths above about 750 nm at normal incidence, and in some instances reflects at least 90 percent of incident energy at wavelengths above about 750 nm at normal incidence. In yet other embodiments, the reflective sheet can be configured to have high percentage of reflection within a bounded range of IR wavelengths. Exemplary ranges include 700-1200 nm, 700-2000 nm, 750-1200 nm, and 750-2000 nm, among others. It should be appreciated that other ranges can be used, to account for performance, location, cost, and other considerations.

With reference again to FIGS. 17-19, each tube 612 is formed of transparent, lightweight flexible plastic coupled at each end to rigid end cap assemblies 624, which facilitate the flow of liquid and gas into and out of the tubes. More particularly, each CSP/PBR assembly 610 may comprise an end cap assembly 624 coupled to an end of the elongated tube 612, or two end cap assemblies 624, with one coupled to each end. End cap assemblies 624 include liquid transfer tube 632 and gas transfer tube 634. Liquid transfer tube 632 provides access to the culture medium 620 and may facilitate addition of nutrients and harvesting of biomass. The CSP/PBR array 601 may further include a rotation assembly 626 operatively connected to one or both ends of the elongated tubes 612. In particular, the rotation assembly may include a motor 628 coupled to end caps 624 by a transmission system 630 to turn the tubes 612 to track the sun.

Positive pressure within the tube maintains the tube in a substantially rigid, cylindrical configuration. In addition to growing biomass, the culture medium within the tube facilitates ballast of the tube on the supporting liquid 616 in pool 619. The tube will float such that the top surface of the liquid within the tube is generally parallel with the surface of liquid on which the tube is floating. The level of liquid within the tube can vary, from empty to fully filled with liquid, as desired. The system may be further configured to extract biomass from within the CSP/PBR assemblies for processing. Various approaches can be used for this purpose. For example, the present inventor's co-pending '949 application, entitled "System for Concentrating Biological Culture and Circulating Biological Culture and Process Fluid," which is incorporated by reference herein for all purposes, discloses effective approaches towards that end.

It should be noted that any of the above-described solar reflector assembly and system embodiments could be modified to incorporate a culture medium to provide different embodiments of a CSP/PBR assembly. For instance, the elongated tube of the CSP/PBR assembly can be configured to achieve various different cross-sectional shapes, as depicted in FIGS. 9a-b with reference to the solar reflector assembly. A CSP/PBR assembly could also have gas bladders to optimize the stability of the system, like the solar reflector assembly depicted in FIGS. 10-11.

In addition, as with the solar reflector assemblies discussed above with reference to FIGS. 1 and 2, the system can include an array of CSP/PBR assemblies configured to reflect solar radiation towards multiple solar collectors. For example, the system can include groupings of CSP/PBR assemblies disposed on opposing sides of linear solar collectors, and the CSP/PBR assemblies can be directed to the closest solar collector. As with the solar reflector assemblies discussed above with reference to FIGS. 2, 4 and 5, an array of CSP/PBR assemblies can be configured to rotate to track the sun to ensure that the reflective solar radiation is directed towards the reservoir. Systems of generating energy from solar radiation including PV cells, such as those discussed above with reference to FIGS. 15 and 16, could also incorporate a culture medium for growing biomass to provide CSP/PBR assemblies. As discussed above, such CSP/PBR systems optimize efficiency by reflecting radiation on the PV cells, and heat-transfer pipes both absorb radiation and serve as a heat sink for the PV cell. Thermo-electric modules employing, e.g., the Seebek effect could also be used, as discussed above.

Figure 21:
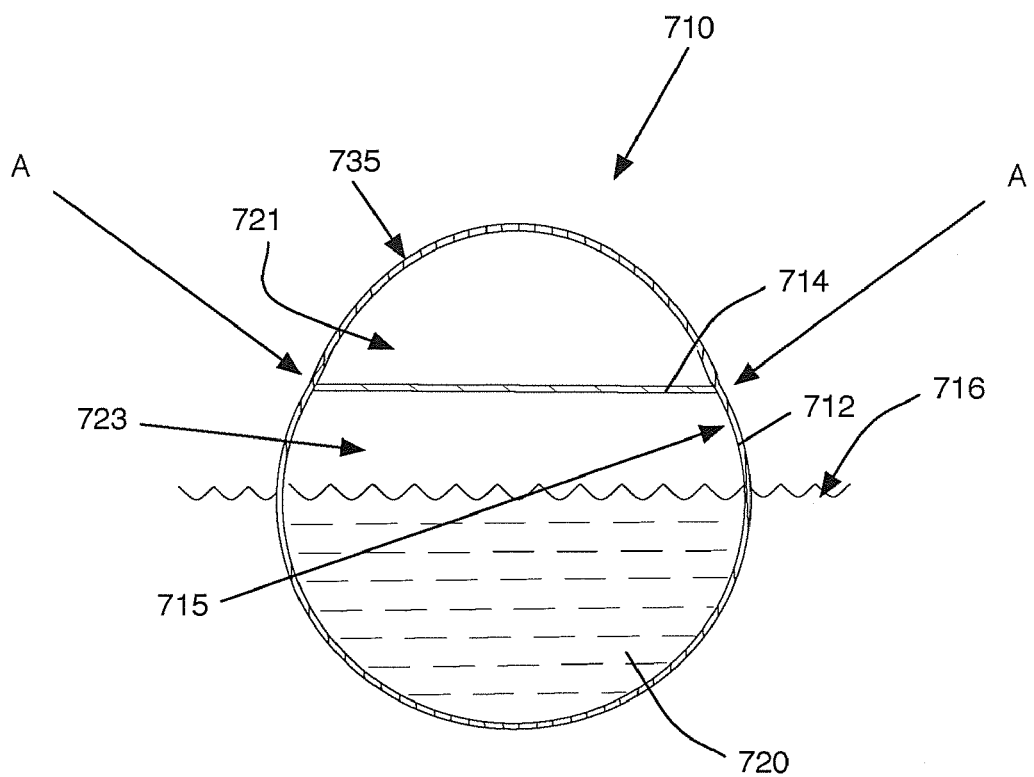
FIG. 21 is a cross-sectional view of an embodiment of a solar reflector assembly in accordance with the present disclosure.

Turning to FIGS. 21-26, exemplary embodiments of a solar reflector assembly having additional shapes and cross-sections are illustrated. FIG. 21 shows an embodiment of a solar reflector assembly 710 comprising an elongated flexible tube 712 having an upper portion 721, a lower ballast portion 723 and an "egg shaped" cross section. The tube 712 contains ballast liquid 720 and sits on an expanse of liquid 716. This configuration is made by coupling the reflective panel or sheet 714 to the inner walls 715 of the tube 712 in two places that would normally form a chord of the circular cross section of a certain length. The reflective sheet 714, however, is slightly shorter than the characteristic chord length, thus pulling in the sides of the circles at the attachment points A. In the case of modest internal pressure that is equal on both sides of the panel, this advantageously guarantees that the panel is flat, even in the case of modest irregularities introduced in manufacturing. The lower ballast portion 723 remains largely (but not exactly) cylindrical, and the upper portion's protruding "egg" shaped dome 735 does not materially impact the performance of the system. It should be noted in this regard that various exaggerated geometries are possible, with very large egg domes having no adverse impact on performance.

Figure 22:
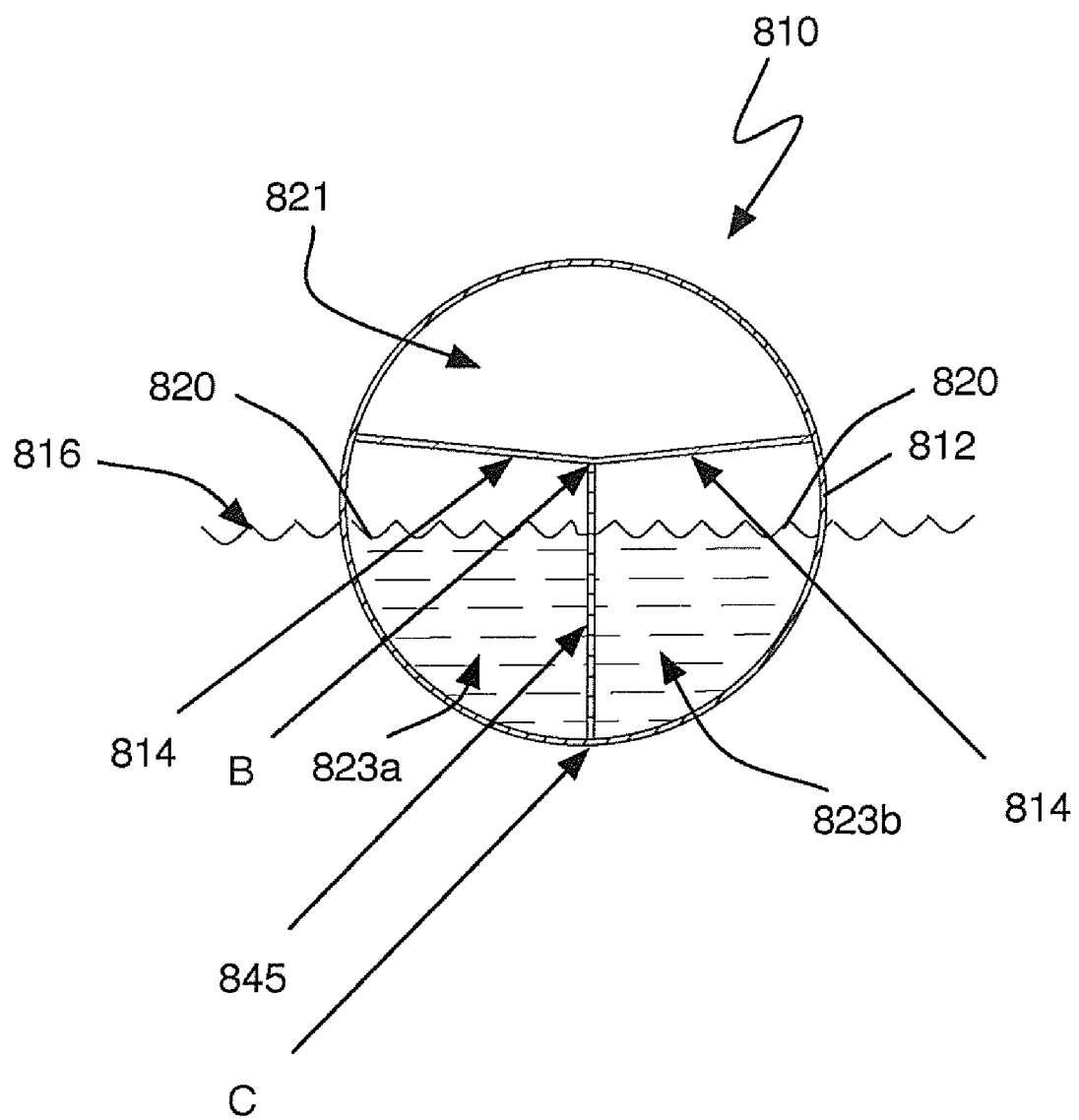
FIG. 22 is a cross-sectional view of an embodiment of a solar reflector assembly in accordance with the present disclosure.
Figure 23:
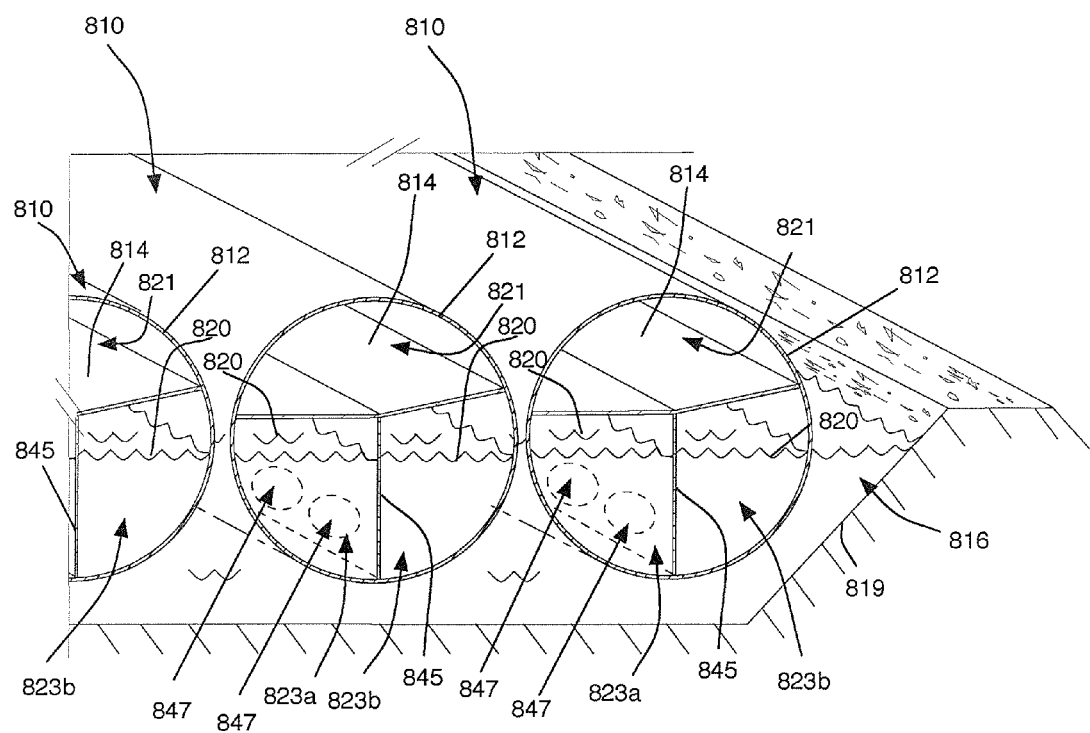
FIG. 23 is a perspective view of an embodiment of an array of solar reflector assemblies of a solar energy collection system in accordance with the present disclosure.

FIGS. 22-23 illustrate exemplary embodiments of solar reflector assemblies 810 with each assembly comprising an elongated flexible tube 812 having an upper portion 821, lower ballast portions 823a, 823b and a "triple panel" cross section. This configuration is made by attaching a second sheet or panel 845 to the reflective sheet or panel 814 either in the middle B or at some other point between the two ends of the reflective sheet 814 and connecting the bottom of the second panel 845 to the bottom of the tube 812 at some middle point C or at some other point. This allows the reflective sheet 814 to be pulled into a "V" formation. There are other ways to create a "V" formation, for example, with a weight attached at the middle of reflective sheet 814. The "V" formation provides the advantage of a tighter focus on the target. The tube 812 contains ballast liquid 820 and sits on an expanse of liquid 816.

The "triple panel" solar reflector assemblies can be arranged in an array configuration, as shown in FIG. 23. This view shows that there are holes 847 defined in the second panel 845. This facilitates the passage of liquid between the two lower ballast portions 823a, 823b created by the second panel 845. Holes 847 facilitate the equalization of the level of ballast within the tube during rotation.

Figure 24:
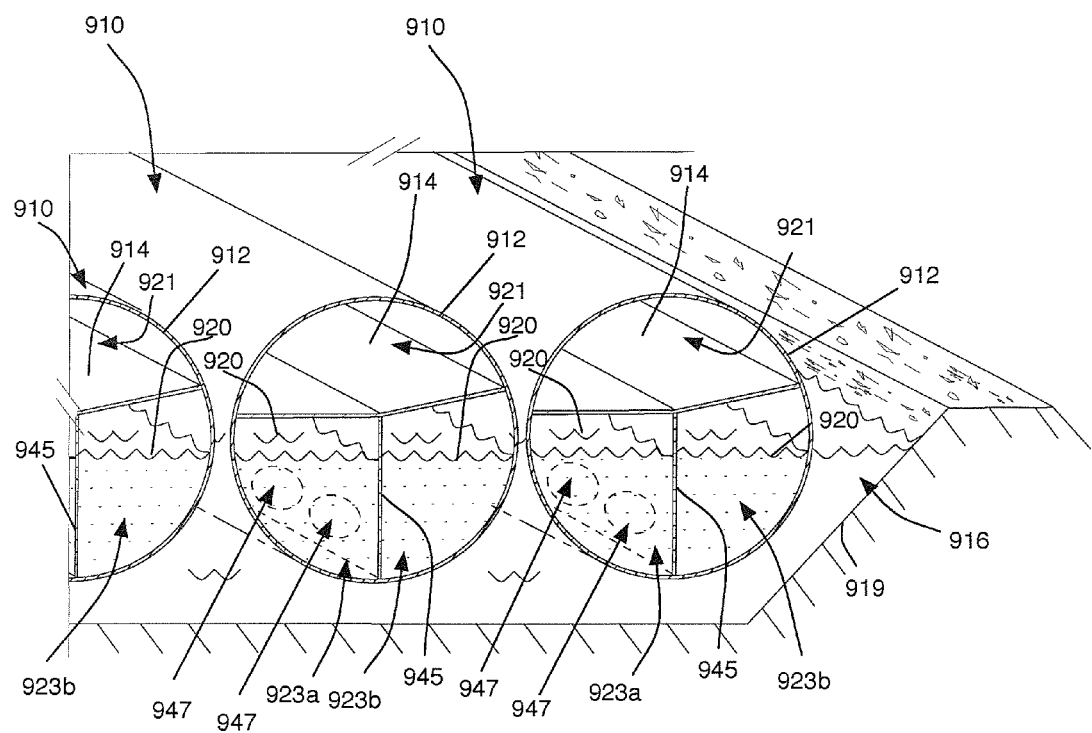
FIG. 24 is a perspective view of an embodiment of an array of solar reflector assemblies of a solar energy collection system in accordance with the present disclosure.

FIG. 24 illustrates an array of CSP/PBR assemblies 910 having a triple-panel configuration. Each CSP/PBR assembly includes an inflated elongated tube 912 having a reflective sheet 914 coupled along opposed sides of the sheet to an interior wall 915 of the tube. A second sheet or panel 945 is attached to the reflective sheet or panel 914 either in the middle or at some other point between the two ends of the reflective sheet 914 and connecting the bottom of the second panel 945 to the bottom of the tube 912 at some point in the middle or at some other point. Thus, the tube 912 is divided into an upper portion 921 and two lower ballast portions 923a, 923b. The reflective sheet is configured to reflect IR radiation towards a solar collector (not shown), while allowing visible light to pass through to a culture medium 920 within the lower ballast portions 923a, 923b of the tube 912. The array is supported by a body of liquid 916 in a pool 919. Holes 947 defined in the second panel 945 facilitate the equalization of the level of ballast within the tube during rotation.

Figure 25:
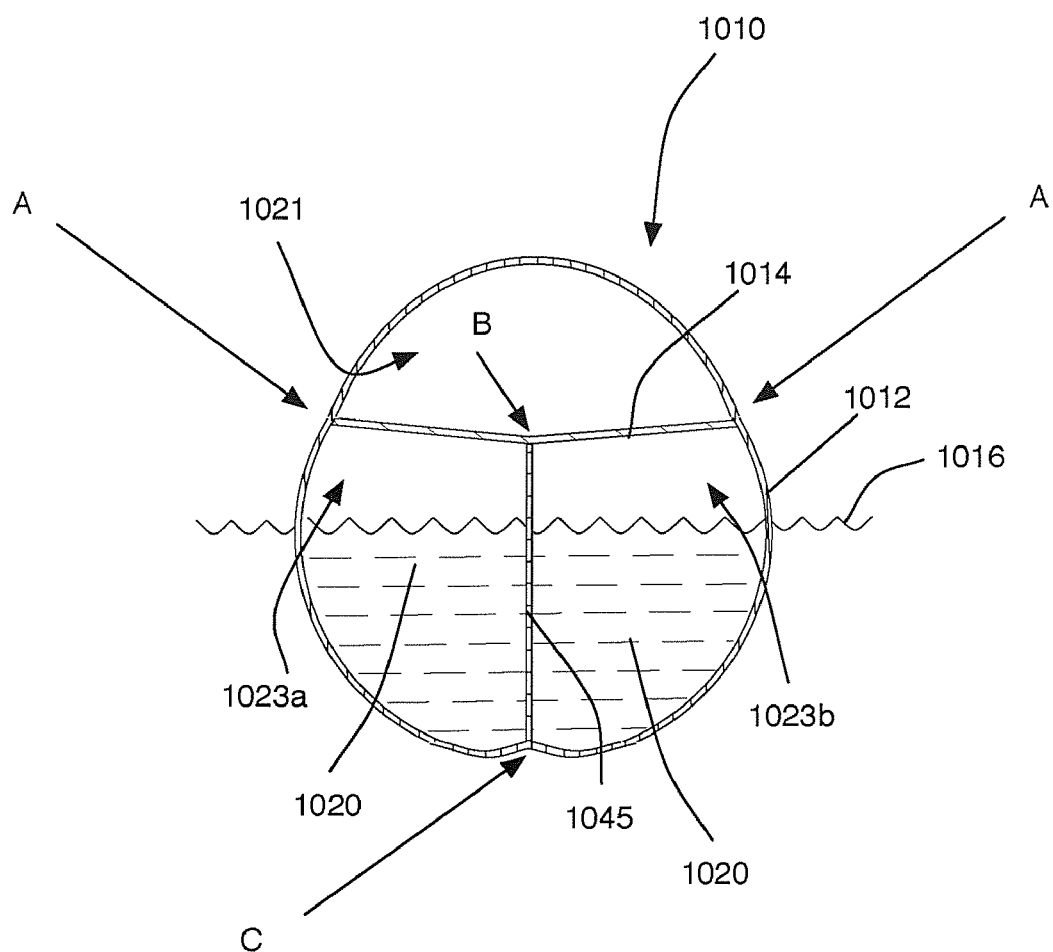
FIG. 25 is a cross-sectional view of an embodiment of a solar reflector assembly in accordance with the present disclosure.
Figure 26:
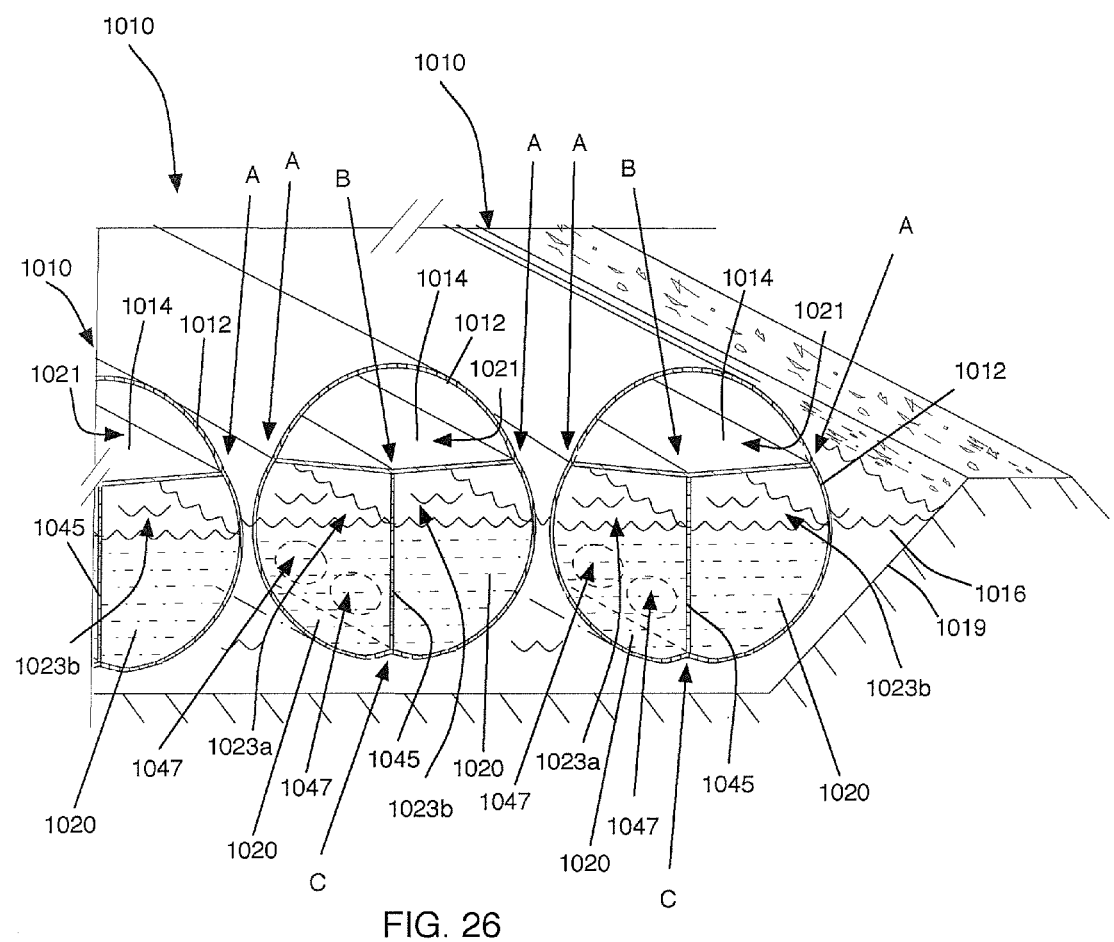
FIG. 26 is a perspective view of an embodiment of an array of solar reflector assemblies of a solar energy collection system in accordance with the present disclosure.

Turning to FIGS. 25-26, an embodiment of a solar reflector assembly having an "Egg shaped, triple panel" cross section will be described. Each solar reflector assembly 1010 comprises an elongated flexible tube 1012 having an upper portion 1021, lower ballast portions 1023a, 1023b and an "egg shaped, triple panel" cross section. This configuration is made by attaching a second sheet or panel 1045 to the reflective sheet or panel 1014 either at a middle point B or at some other point between the two ends of the reflective sheet 1014 and connecting the bottom of the second panel 1045 to the bottom of the tube 1012 at some middle point C or at some other point. This allows the reflective sheet 1014 to be pulled into a "V" formation. The second panel 1045, is shorter than otherwise necessary which leads to the deformation at C. Laying this reflector assembly on an expanse of liquid 1016 and using internal ballast provides a stable, level reflector array that is easily turned by actuators at each end.

The reflective sheet 1014 is slightly shorter than the characteristic chord length, thus pulling in the sides of the circles at the attachment points A. In the case of modest internal pressure that is equal on both sides of the panel, this advantageously guarantees that the panel is flat, even in the case of modest irregularities introduced in manufacturing. The lower ballast portions 1023a, 1023b together remain largely cylindrical. Holes 1047 defined in the second panel 1045 facilitate the equalization of the level of ballast within the tube during rotation. As shown in FIG. 26, the "egg shaped, triple panel" solar reflector assemblies can be arranged in an array configuration. The array of solar reflector assemblies is supported by a body of liquid 1016 in a pool 1019.

Figure 27A:
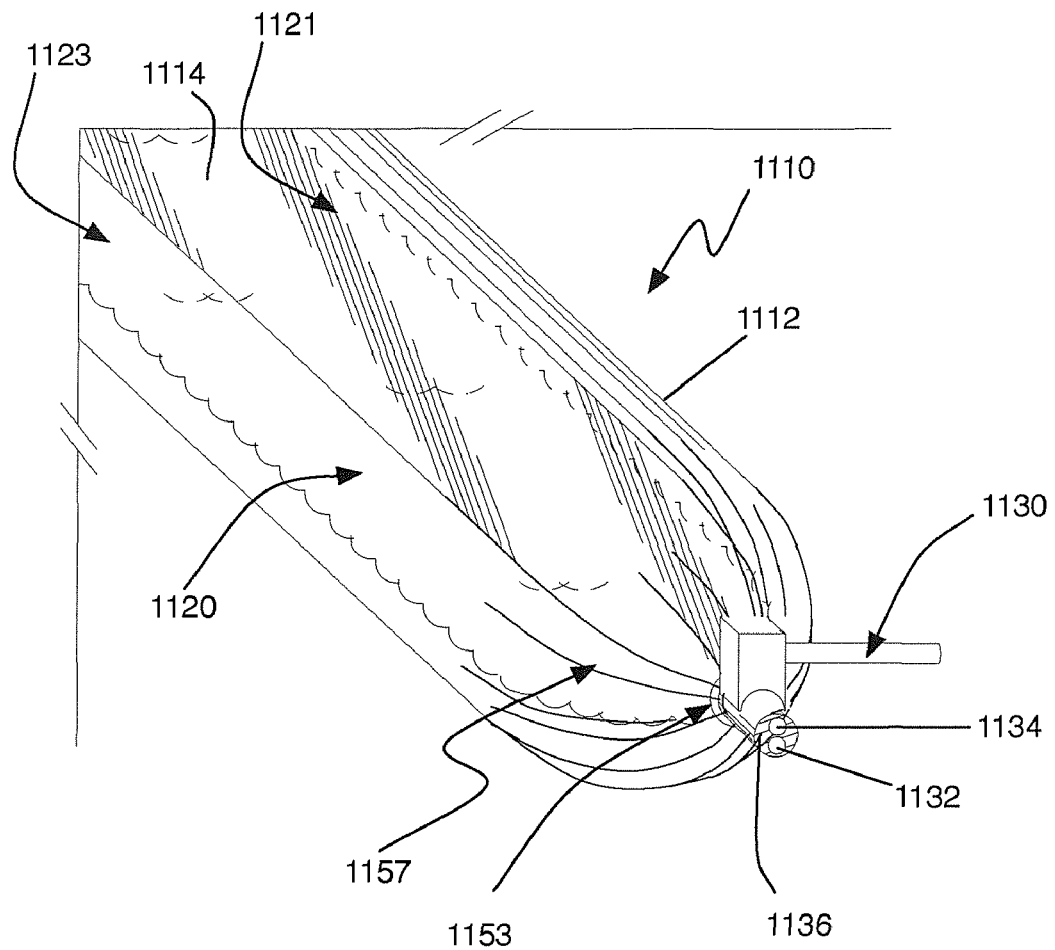
FIG. 27a is a perspective view of an embodiment of a solar reflector assembly in accordance with the present disclosure.
Figure 27B:
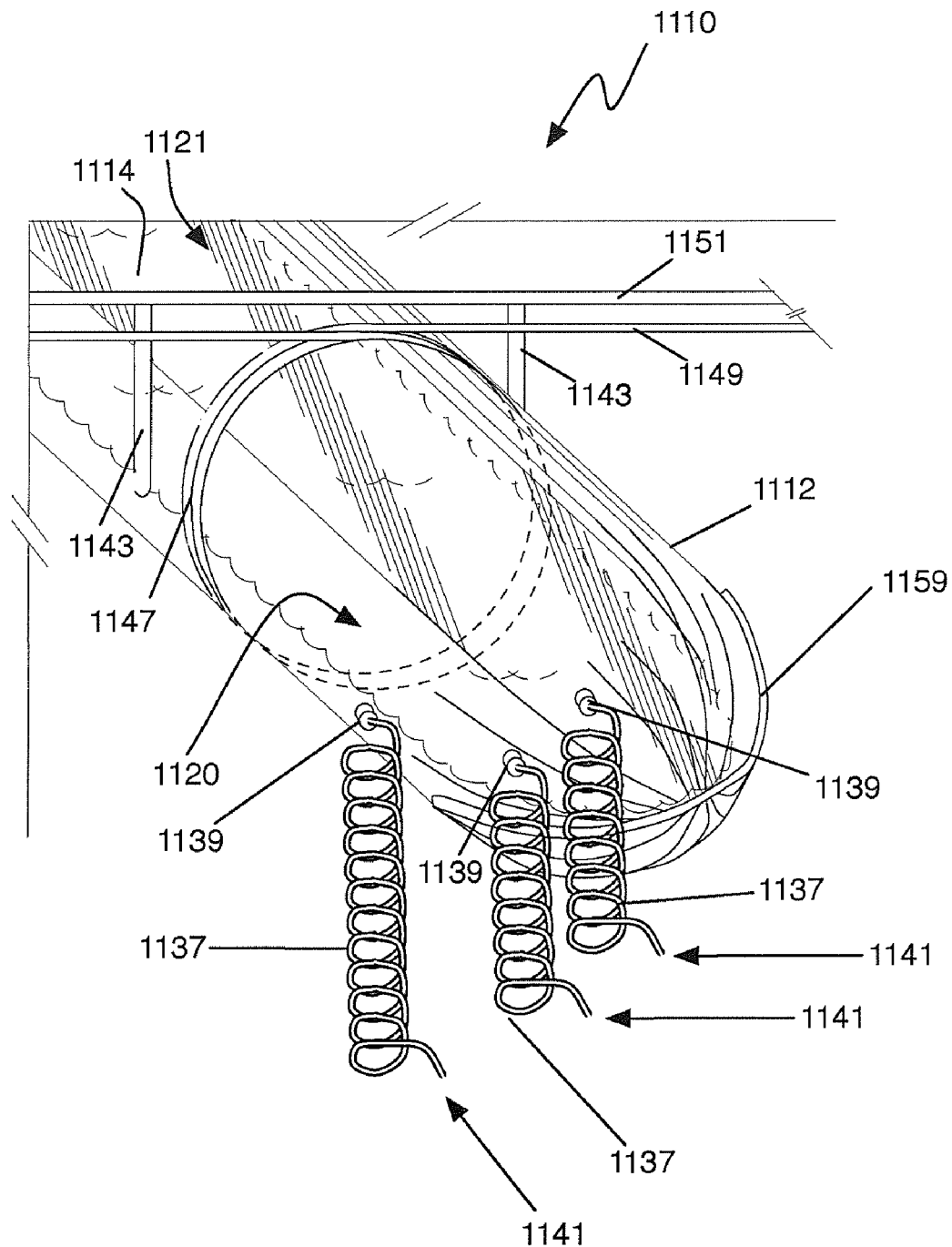
FIG. 27b view of an embodiment of a solar reflector assembly having pass-throughs in accordance with the present disclosure.

FIGS. 27a-27b illustrate further exemplary embodiments of solar reflector assemblies having simplified end designs. FIG. 27a shows an embodiment of a solar reflector assembly utilizing direct coupling to a rotation axle. Solar reflector assembly 1110 comprises an elongated flexible tube 1112 having an upper portion 1121 and a lower ballast portion 1123. The elongated tube 1112 is directly coupled to a rotation axle 1136 without an end cap component. It can be seen that the tube 1112 develops folds 1157 where it is bunched up and locked onto the axle 1136. A retaining ring 1153 facilitates locking of the tube 1112 onto the axle 1136. Axle 1136 includes liquid transfer tube 1132 and gas transfer tube 1134. The axle 1136 may also be coupled to a transmission system 1130 that serves to turn the tube 1112 to track the sun.

FIG. 27b shows an embodiment of a solar reflector assembly without an end cap or a rotation axle, but instead is heat-sealed at its ends and employs pass-through fittings for ingress and egress of fluids. Solar reflector assembly 1110 comprises an elongated flexible tube 1112 having an upper portion 1121 and a lower ballast portion 1123. In this exemplary embodiment, solar reflector assembly 1110 employs a heat-seal 1159 at the end. Pass-through fittings 1139 provide access to the inside of the tube 1112 to facilitate flow of gas and/or liquid into and out of the tubes through fluid lines 1137.

Rotation of the tube 1112 is accomplished by a rotation assembly that includes a strap 1149 and a stabilizer 1151. In this embodiment, the strap is coupled to the tube 1112 by being wrapped 1147 around the tube, but other means of coupling a rotation assembly to the tube are possible. The tube 1112 is rotated by pulling the strap 1149 in the direction corresponding to the desired turning direction for the tube 1112. Stabilizer 1151 with stabilizer rods 1143 prevents lateral movement of the tube when strap 1149 is pulled, thereby inducing rotation as opposed to translation. It will be appreciated that a rotation assembly can be placed anywhere along the length of the tube, and that multiple different means, including end-caps, axles, straps and other means can be employed simultaneously to impart rotation on the tube.

It should be noted that exemplary embodiments described herein can be controlled by a computer. Either an open loop system that is pre-programmed with the position of the sun in the sky or a closed loop system that has a sensor or sensors that detect the position of the sun in the sky or a combination of these two strategies can be used to control the position of the tubes.

Thus, it is seen that systems and methods of generating energy from solar radiation are provided. It should be understood that any of the foregoing configurations and specialized components or chemical compounds may be interchangeably used with any of the systems of the preceding embodiments. Although exemplary embodiments of the present disclosure are described hereinabove, it will be evident to one skilled in the art that various changes and modifications may be made therein without departing from the disclosure. It is intended in the appended claims to cover all such changes and modifications that fall within the true spirit and scope of the disclosure.

What is claimed is:

1. A solar reflector assembly comprising:
   an inflatable elongated tube having a substantially circular cross section and two internal attachment points, the distance between the two attachment points forming a chord length of the substantially circular cross section, the tube having an upper portion formed at least partially of flexible material and a lower portion integrally formed with the upper portion, the lower portion being a ballast portion formed at least partially of flexible material, the lower ballast portion defining a reservoir containing liquid facilitating ballast, the ballast liquid having a top surface generally parallel to the surface of a supporting body of liquid; and
   a reflective sheet adapted to reflect solar radiation and being coupled to a wall of the tube at the two attachment points, the reflective sheet being shorter than the chord length such that the reflective sheet pulls in the walls of the tube at the two attachment points and the cross section of the tube becomes substantially egg shaped to reflect solar radiation, the upper portion and lower ballast portion of the elongated tube being separated only by the reflective sheet;
   wherein the elongated tube has an axis of rotation oriented generally parallel to a surface of the supporting body of liquid.

2. The solar reflector assembly of claim 1 further comprising at least one end cap assembly coupled to the elongated tube, the at least one end cap assembly facilitating flow of gas and/or liquid into and out of the elongated tube.

3. The solar reflector assembly of claim 1 wherein the reflective sheet is coupled to the elongated tube in a manner to provide a pressure differential between opposing sides of the reflective sheet such that the reflective sheet can be given a prescribed shape to facilitate reflection of solar radiation towards a solar collector.

4. The solar reflector assembly of claim 1 wherein the reflective sheet is coupled to an interior wall of the elongated tube.

5. The solar reflector assembly of claim 1 wherein the elongated tube further comprises a culture medium for photosynthetic biomass.

6. The solar reflector assembly of claim 1 wherein the reflective sheet facilitates equilibrium of pressure on its opposing sides.

7. The solar reflector assembly of claim 1 further comprising at least one elongated reservoir extending the length of the tube for passing a heat-transfer fluid therethrough, the elongated reservoir positioned above the reflective sheet such that solar radiation reflected by the reflective sheet is directed towards the elongated reservoir.

8. The solar reflector assembly of claim 7 wherein the at least one elongated reservoir comprises a plurality of elongated reservoirs positioned above the reflective sheet, the plurality of elongated reservoirs defining multiple focal areas of reflected radiation present at different angles of incident solar radiation.

9. The solar reflector assembly of claim 1 further comprising a rotation assembly coupled to the elongated tube.

10. The solar reflector assembly of claim 1 further comprising a solar collector spaced apart from the elongated tube and positioned to receive reflected solar radiation from the reflective sheet.

11. The solar reflector assembly of claim 1 further comprising one or more pass-through fittings coupled to the elongated tube facilitating flow of gas and liquid into and out of the elongated tube.

12. The solar reflector assembly of claim 1 wherein the reflective sheet substantially reflects a first prescribed wavelength range and substantially transmits a second prescribed wavelength range therethrough.

13. A system for generating energy from solar radiation, comprising:
a pool housing a supporting body of liquid;
one or more solar reflector assemblies floating on the supporting body of liquid, each solar reflector assembly including:
an inflatable elongated tube having a substantially circular cross section and two internal attachment points, the distance between the two attachment points forming a chord length of the substantially circular cross section, the tube having an upper portion at least partially formed of flexible material and a lower portion integrally formed with the upper portion, the lower portion being a ballast portion at least partially formed of flexible material, the lower ballast portion defining a reservoir containing liquid facilitating ballast, the ballast liquid having a top surface generally parallel to the surface of the supporting body of liquid,
the elongated tube having an axis of rotation oriented generally parallel to a surface of the supporting body of liquid; and
a reflective sheet adapted to reflect solar radiation and being coupled to a wall of the tube at the two attachment points, the reflective sheet being shorter than the chord length such that the reflective sheet pulls in the walls of the tube at the two attachment points and the cross section of the tube becomes substantially egg shaped to reflect solar radiation, the upper portion and lower ballast portion of the elongated tube being separated only by the reflective sheet; and
a solar collector spaced apart from the elongated tube and positioned to receive reflected solar radiation from the reflective sheet.

14. The system of claim 13 further comprising at least one end cap assembly coupled to the elongated tube, the at least one end cap assembly facilitating flow of liquid and/or gas into and out of the elongated tube.

15. The system of claim 13 further comprising an electrical generator assembly operatively coupled to the solar collector to convert the reflected solar radiation to electricity.

16. The system of claim 13 further comprising a rotation assembly coupled to at least one of the elongated tubes to induce controlled rotation of the elongated tube to direct the reflected solar radiation towards the solar collector.

17. The system of claim 13, wherein the reflective sheet is coupled to the elongated tube in a manner to provide a pressure differential between opposing sides of the reflective sheet such that the reflective sheet can be given a prescribed shape to facilitate reflection of solar radiation towards the solar collector.

18. A system as defined in claim 13, wherein the solar reflector assembly facilitates equilibrium of pressure on opposing sides of the reflective sheet.

19. A solar reflector assembly comprising:
an inflatable elongated tube having a substantially circular cross section and two internal attachment points, the distance between the two attachment points forming a chord length of the substantially circular cross section, the tube having an upper portion formed at least partially of flexible material and a lower portion integrally formed with the upper portion, the lower portion being a ballast portion formed at least partially of flexible material, the lower ballast portion defining a reservoir containing liquid facilitating ballast, the ballast liquid having a top surface substantially coplanar with the surface of a supporting body of liquid; and
a reflective sheet adapted to reflect solar radiation and being coupled to a wall of the tube at the two attachment points, the reflective sheet being shorter than the chord length such that the reflective sheet pulls in the walls of the tube at the two attachment points and the cross section of the tube becomes substantially egg shaped to reflect solar radiation;
wherein the elongated tube has an axis of rotation oriented generally parallel to a surface of a supporting body of liquid.

20. The solar reflector assembly of claim 19 wherein the reflective sheet comprises longitudinal sides raised relative to an intermediate section.

\* \* \* \* \*